United States Patent
Adachi et al.

(10) Patent No.: US 11,985,897 B2
(45) Date of Patent: May 14, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Emiko Adachi, Nonoichi Ishikawa (JP); Yukie Nishikawa, Nonoichi Ishikawa (JP); Kotaro Zaima, Nomi Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 129 days.

(21) Appl. No.: 17/189,059

(22) Filed: Mar. 1, 2021

(65) Prior Publication Data
US 2022/0077230 A1    Mar. 10, 2022

(30) Foreign Application Priority Data
Sep. 10, 2020    (JP) .................... 2020-152177

(51) Int. Cl.
H10N 19/00       (2023.01)
H01L 23/34       (2006.01)
(Continued)

(52) U.S. Cl.
CPC ......... *H10N 19/00* (2023.02); *H01L 29/0696* (2013.01); *H01L 29/7804* (2013.01);
(Continued)

(58) Field of Classification Search
CPC ......... H01L 35/10; H01L 23/34; H01L 25/16; H01L 29/04; H01L 29/1095; H01L 29/16;
(Continued)

(56) References Cited

U.S. PATENT DOCUMENTS 7,595,224 B2    9/2009  Kobayashi
8,169,054 B2    5/2012  Oikawa
(Continued)

FOREIGN PATENT DOCUMENTS

JP    2006-302977 A    11/2006
JP    2007-234746 A    9/2007
(Continued)

OTHER PUBLICATIONS

Notice of Reasons for Refusal dated Jun. 16, 2023 in corresponding Japanese Patent Application No. 2020-152177, 8 pages (with Translation).

*Primary Examiner* — Natalia A Gondarenko
(74) *Attorney, Agent, or Firm* — Kim & Stewart LLP

(57) ABSTRACT

A semiconductor device includes a semiconductor layer, a first electrode on a first surface of the semiconductor layer, a plurality of second electrodes on a second surface of the semiconductor layer, a control electrode between the first electrode and each of the plurality of second electrodes and electrically insulated from the semiconductor layer and each of the plurality of second electrodes, and a resin layer partially covering the second surface of the semiconductor layer and having a plurality of openings through which the respective second electrodes are at least partially exposed. Each of the plurality of openings has rounded corners. The device further includes a sensor element above the second surface of the semiconductor layer and covered by a first part of the resin layer surrounded by the openings.

25 Claims, 15 Drawing Sheets

(51) Int. Cl.
*H01L 25/16* (2023.01)
*H01L 29/06* (2006.01)
*H01L 29/78* (2006.01)
*H10N 10/82* (2023.01)

(52) U.S. Cl.
CPC ......... *H01L 29/7813* (2013.01); *H10N 10/82* (2023.02); *H01L 23/34* (2013.01); *H01L 25/16* (2013.01)

(58) Field of Classification Search
CPC ........... H01L 29/41741; H01L 29/4236; H01L 29/7393; H01L 29/7397; H01L 29/7804; H01L 29/7808; H01L 29/7813; H01L 29/7815; H01L 29/66734; H01L 29/66106; H01L 29/66666; H01L 29/0619; H01L 29/7811; H01L 29/0696; H01L 29/861; H01L 29/866; H01L 29/404; H01L 29/402; H01L 29/7395; H01L 29/408; H01L 29/42368; H01L 29/872; H01L 27/0255; H01L 27/0629; H01L 27/0664; H01L 27/16; H01L 27/04; H01L 27/088; H01L 27/1204; H01L 27/12; H01L 29/0804–0834; H01L 29/1004; H01L 29/41708; H01L 29/42304; H01L 29/66325; H01L 29/66333–66348; H01L 29/6634; H01L 23/18; H01L 23/28; H01L 23/293; H01L 23/29; H01L 23/31; H01L 23/3121; H01L 29/7375; G01K 7/01; H10N 19/00; H10N 10/82

USPC .......................... 257/470, 488, 495, 492, 493
See application file for complete search history.

(56) References Cited

U.S. PATENT DOCUMENTS

| | | | |
|---|---|---|---|
| 8,441,122 B2 | 5/2013 | Fukuoka et al. | |
| 2006/0255361 A1 | 11/2006 | Oyabe et al. | |
| 2015/0357405 A1* | 12/2015 | Ueda | H01L 29/872 257/77 |
| 2017/0236908 A1* | 8/2017 | Naito | H01L 29/4238 257/48 |
| 2020/0043823 A1 | 2/2020 | Nagaoka et al. | |
| 2020/0091139 A1* | 3/2020 | Iwamizu | H01L 23/49575 |
| 2020/0105923 A1* | 4/2020 | Nishimura | H01L 29/7813 |
| 2020/0144149 A1* | 5/2020 | Kubouchi | H01L 29/32 |
| 2021/0166984 A1 | 6/2021 | Yokogawa et al. | |
| 2021/0398812 A1* | 12/2021 | Kodama | H01L 29/78 |
| 2022/0059688 A1* | 2/2022 | Nakata | H01L 29/7804 |

FOREIGN PATENT DOCUMENTS

| | | | |
|---|---|---|---|
| JP | 2007-311771 A | 11/2007 | |
| JP | 2012-138584 A | 7/2012 | |
| JP | 2018-160488 A | 10/2018 | |
| WO | WO-2018173477 A1 * | 9/2018 | ............ H01L 23/34 |
| WO | 2019/208755 A1 | 10/2019 | |

* cited by examiner

FIG. 3A
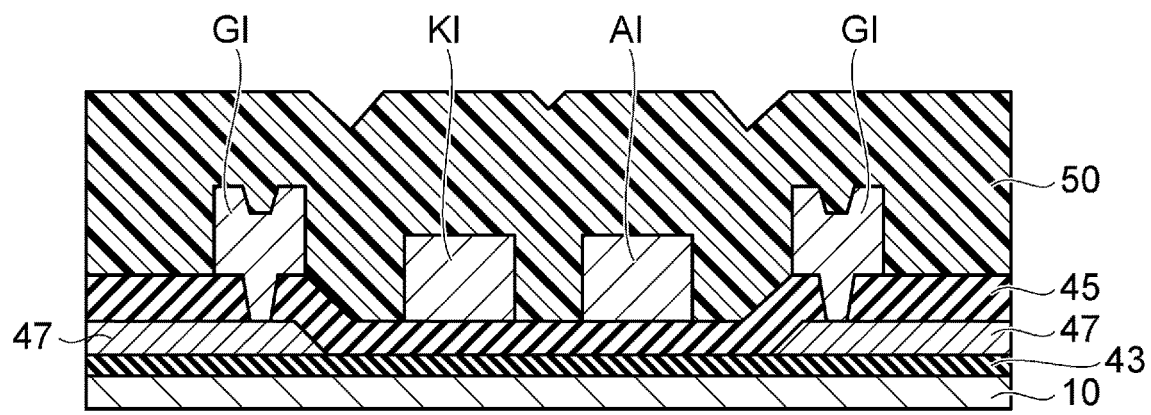
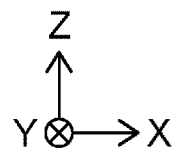
FIG. 3B
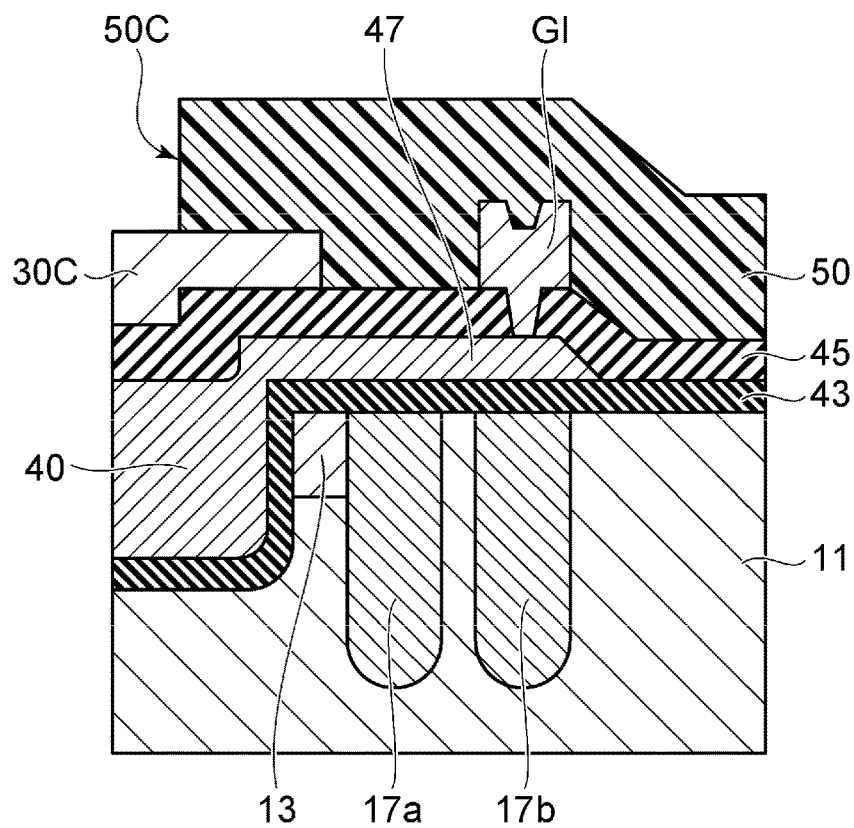
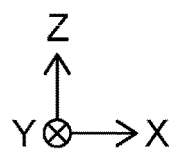

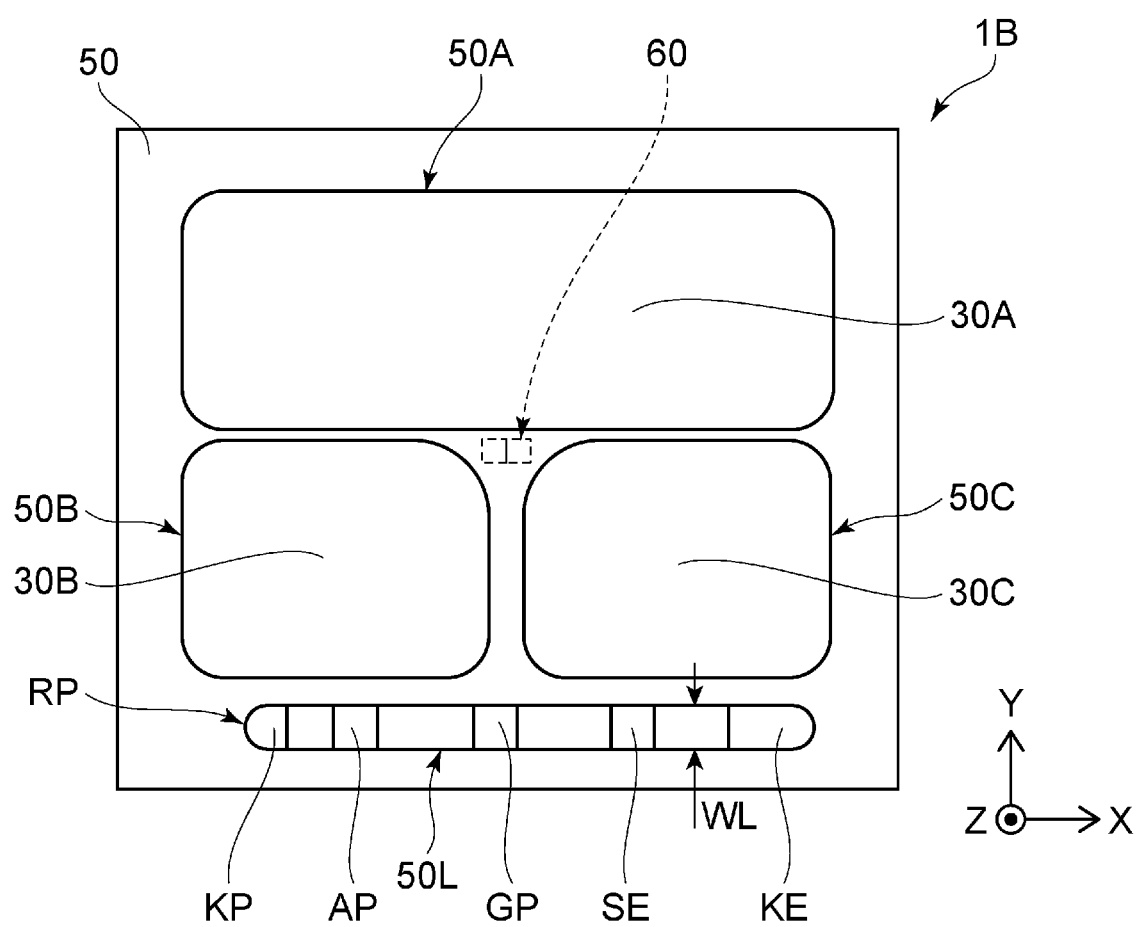

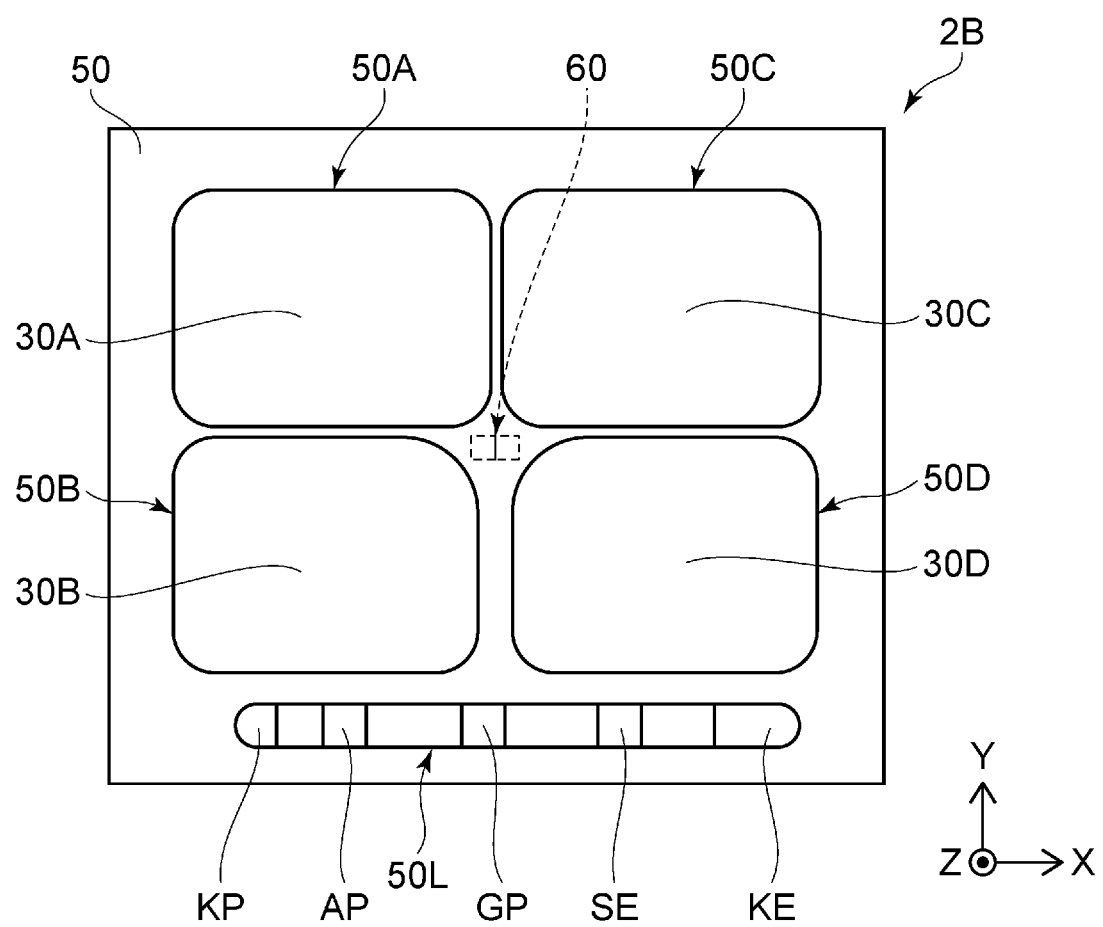

FIG. 15A
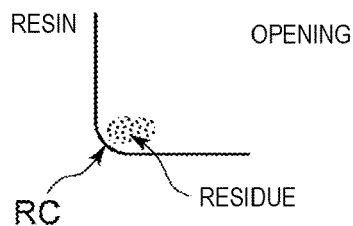
FIG. 15B
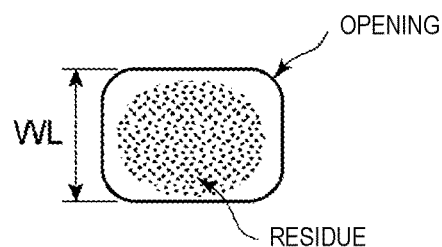
FIG. 15C
| DIMENSION (μm) | RC | WL |
|---|---|---|
| 600 | NO RESIDUE | NO RESIDUE |
| 300 | NO RESIDUE | RESIDUE PRESENT |
| 100 | RESIDUE PRESENT | RESIDUE PRESENT |
| 20 | RESIDUE PRESENT | RESIDUE PRESENT |
FIG. 15D
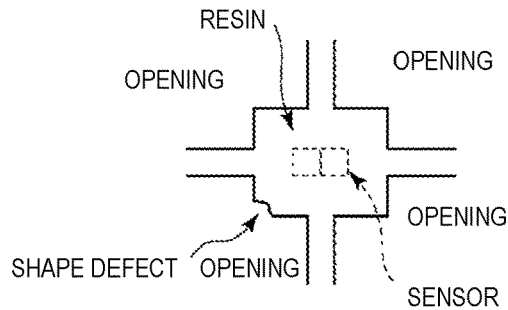

US 11,985,897 B2

SEMICONDUCTOR DEVICE

CROSS-REFERENCE TO RELATED APPLICATION(S)

This application is based upon and claims the benefit of priority from Japanese Patent Application No. 2020-152177, filed Sep. 10, 2020, the entire contents of which are incorporated herein by reference.

FIELD

Embodiments described herein relate generally to a semiconductor device.

BACKGROUND

There is a semiconductor device including a temperature sensor on a semiconductor chip having a switching element such as a transistor. It is preferable that such a temperature sensor fits a layout of the switching element and is provided at a position where a chip temperature can be accurately detected.

BRIEF DESCRIPTION OF THE DRAWINGS

FIG. 3A and FIG. 3B are schematic diagrams showing a semiconductor device according to an embodiment.

FIG. 4 is a schematic diagram showing a semiconductor device according to an embodiment.

FIG. 6 is a schematic diagram showing a semiconductor device according to an embodiment.

FIG. 15A to FIG. 15D are schematic diagrams showing characteristics of a semiconductor device according to an embodiment.

DETAILED DESCRIPTION

Figure 1A:
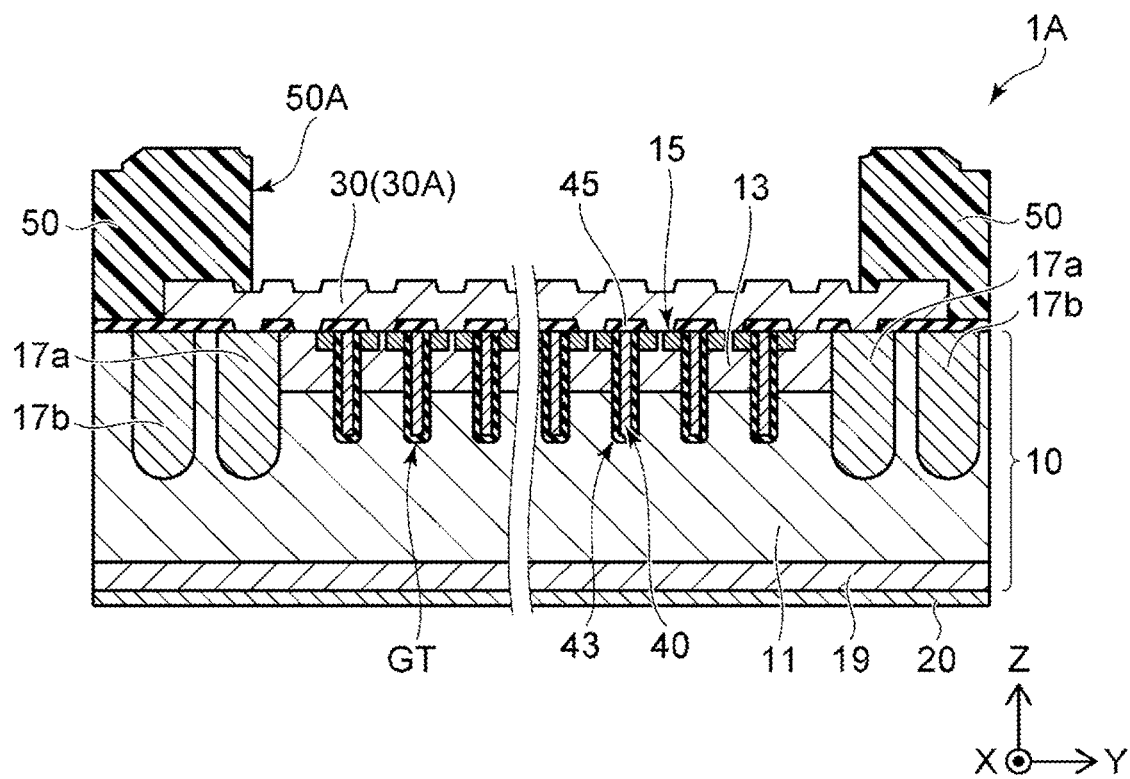
FIG. 1A and FIG. 1B are schematic diagrams showing a semiconductor device according to an embodiment.

Embodiments provide a semiconductor device in which a temperature sensor is suitably disposed.

In general, according to one embodiment, a semiconductor device includes a semiconductor layer, a first electrode on a first surface of the semiconductor layer, a plurality of second electrodes on a second surface of the semiconductor layer, a control electrode between the first electrode and each of the plurality of second electrodes and electrically insulated from the semiconductor layer and each of the plurality of second electrodes, and a resin layer partially covering the second surface of the semiconductor layer and having a plurality of openings through which the respective second electrodes are at least partially exposed. Each of the plurality of openings has rounded corners. The device further includes a sensor element above the second surface of the semiconductor layer and covered by a first part of the resin layer surrounded by the openings.

Hereinafter, embodiments will be described with reference to the drawings. A description of an element or aspect having the same reference numeral may be omitted as appropriate after an initial description. The drawings are schematic or conceptual. As such, relationships between a thickness and a width of each element, a ratio of sizes between the elements, and the like shown in the drawings are not necessarily the same as the actual ones. Even when the same element is shown in two or more drawings, its dimension and ratio may be illustrated differently.

In the following description arrangement and a configuration of each element will generally be described using an X axis, a Y axis, and a Z axis shown in each drawing. The X axis, the Y axis, and the Z axis are orthogonal to one another and separately represent an X direction, a Y direction, and a Z direction. In addition, the +Z direction may be referred to as an upper side direction, an upward direction or the like, and a direction opposite to the +Z direction may be described as a lower side direction, a lower direction, or the like.

Figure 1B:
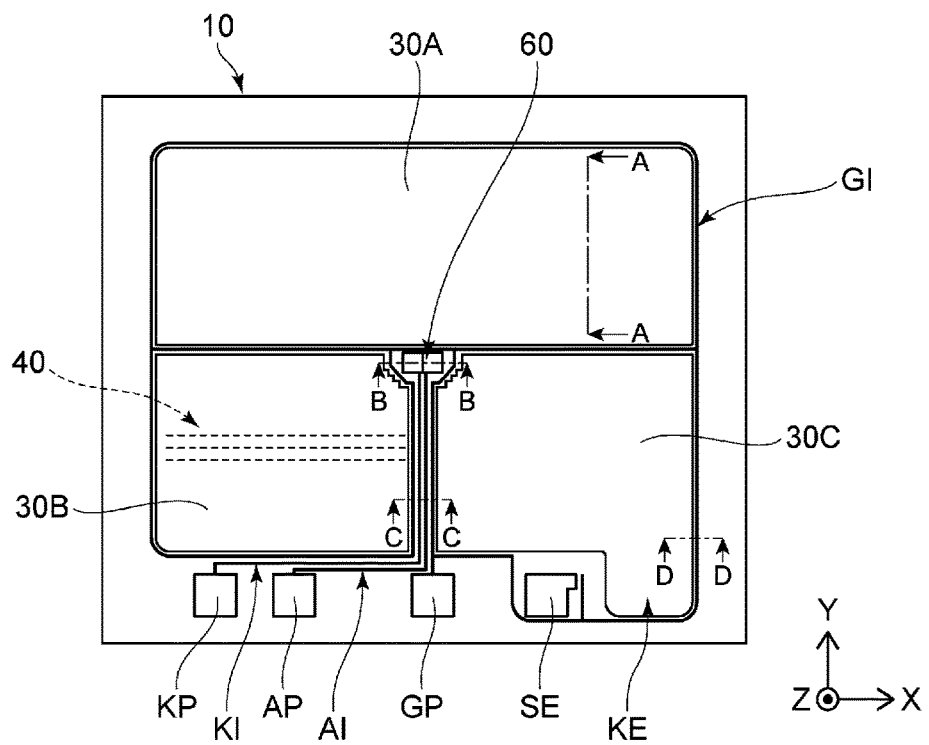

FIGS. 1A and 1B are schematic diagrams showing a semiconductor device 1A according to an embodiment. FIG. 1A is a cross-sectional view taken along a line A-A in FIG. 1B. FIG. 1B is a plan view showing an upper surface of the semiconductor device 1A.

The semiconductor device 1A is, for example, an insulated gate bipolar transistor (IGBT). The semiconductor device 1A may be a MOSFET instead. The same applies to the other embodiments described below.

As shown in FIG. 1A, the semiconductor device 1A includes a semiconductor layer 10, a first electrode 20, second electrodes 30 (30A-30C), and a control electrode 40. The semiconductor layer 10 is, for example, silicon. The first electrode 20 is provided on a back or lower surface of the semiconductor layer 10. The second electrode 30 is provided on a front or upper surface of the semiconductor layer 10. That is, the semiconductor layer 10 is located between the first electrode 20 and the second electrodes 30. The first electrode 20 is, for example, a collector. The second electrode 30 is, for example, an emitter. The first electrode 20 and the second electrode 30 are, for example, a metal layer containing aluminum.

The semiconductor layer 10 includes a first conductivity type first semiconductor layer 11, a second conductivity type second semiconductor layer 13, a first conductivity type third semiconductor layer 15, a second conductivity type fourth semiconductor layer 17, and a second conductivity type fifth semiconductor layer 19.

The first semiconductor layer 11 extends between the first electrode 20 and the second electrodes 30. The first semiconductor layer 11 is, for example, an n-type base layer. As shown in FIG. 1B, there are a plurality of second electrodes 30A-30C on the semiconductor layer 11. That is, the first semiconductor layer 11 extends between the first electrode 20 and the plurality of second electrodes 30.

The second semiconductor layer 13 is provided between the first semiconductor layer 11 and the second electrodes (30A-30C). The second semiconductor layer 13 is, for example, a p-type base layer. The second semiconductor layer 13 is electrically connected to the corresponding second electrode 30. For example, a plurality of second semiconductor layers 13 are provided between the first semiconductor layer 11 and the respective second electrodes 30.

The third semiconductor layer 15 is selectively provided between the second semiconductor layer 13 and the second electrode 30. The third semiconductor layer 15 is, for example, an n-type emitter layer. Each of the second electrodes 30 is electrically connected to the corresponding third semiconductor layer 15.

The fourth semiconductor layer 17 is provided between the first semiconductor layer 11 and the second electrodes 30 so as to surround the second semiconductor layers 13. That is, the fourth semiconductor layer 17 is formed along a front or upper surface of the semiconductor layer 10 to surround the second semiconductor layers 13. The fourth semiconductor layer 17 is, for example, a p-type guard ring. The fourth semiconductor layer 17 is provided, for example, so as to surround a region in which the plurality of second semiconductor layers 13 and the control electrode 40 are provided.

In this example, a fourth semiconductor layer 17a and a fourth semiconductor layer 17b are provided. The fourth semiconductor layer 17a is in contact with the second semiconductor layers 13. The fourth semiconductor layer 17b is provided on the outside of the fourth semiconductor layer 17a so as to be separated from the fourth semiconductor layer 17a.

The fifth semiconductor layer 19 is provided between the first semiconductor layer 11 and the first electrode 20. The fifth semiconductor layer 19 is, for example, a p-type collector layer. The fifth semiconductor layer 19 is electrically connected to the first electrode 20.

The control electrode 40 is provided between the semiconductor layer 10 and the second electrodes 30. The control electrode 40 is provided inside a trench GT provided on the front surface side of the semiconductor layer 10. The control electrode 40 is, for example, a gate electrode. The control electrode 40 is, for example, polysilicon having conductivity.

The control electrode 40 is electrically insulated from the semiconductor layer 10 by an insulating film 43, and is electrically insulated from the second electrode 30 by an insulating film 45. The insulating film 43 and the insulating film 45 are, for example, silicon oxide films. The control electrode 40 extends into the semiconductor layer 10 and faces the first semiconductor layer 11 and the second semiconductor layer 13 via the insulating film 43. The third semiconductor layer 15 is provided on the second semiconductor layer 13 and is in contact with the insulating film 43.

The semiconductor device 1A further includes a resin layer 50. The resin layer 50 covers the front surface of the semiconductor layer 10 and has openings exposing a part of the second electrodes 30. The resin layer 50 is, for example, polyimide.

As shown in FIG. 1B, the semiconductor device 1A includes a plurality of second electrodes 30A to 30C. The second electrodes 30A to 30C are separated from one another on the front surface of the semiconductor layer 10. The semiconductor device 1A further includes a sensor element 60, a control wiring GI, and sensor wirings KI and AI. FIG. 1B shows a front or upper surface of the semiconductor device 1A excluding the resin layer 50.

The sensor element 60 is provided in a region surrounded by the second electrodes 30A to 30C. The sensor element 60 is, for example, a temperature sensor. In the semiconductor device 1A, current flows from the first electrode 20 to the second electrodes 30A to 30C. The sensor element 60 is provided at a position surrounded by the second electrodes 30A, 30B, and 30C. That is, the sensor element 60 is provided at a center of or in a vicinity of a center of the front surface of the semiconductor layer to which the current flows from the back surface. Accordingly, a temperature of the semiconductor device 1A can be accurately detected.

The control wiring GI is provided along outer edges of the second electrodes 30A to 30C so as to surround each of the second electrodes 30A to 30C. The sensor wirings KI and AI are provided between the second electrode 30B and the second electrode 30C, and are connected to the sensor element 60.

The semiconductor device 1A further includes, for example, contact pads GP, AP, KP, SE, and KE. The contact pads GP, AP, and KP are arranged, for example, along one side of the semiconductor layer 10. The contact pads GP, AP, and KP are connected to the control wiring GI, the sensor wiring AI, and the sensor wiring KI, respectively.

The semiconductor device 1A further includes a current sensor element provided under the contact pad SE. The current sensor element has, for example, the same structure as the cross section shown in FIG. 1A. The contact pad SE is, for example, an emitter electrode of the current sensor element.

A contact pad KE is, for example, a Kelvin emitter electrode pad. The contact pad KE is, for example, a part of the second electrode 30C. For example, the contact pad KE, together with the contact pad SE, is electrically connected to an external current monitor circuit.

Figure 2A:
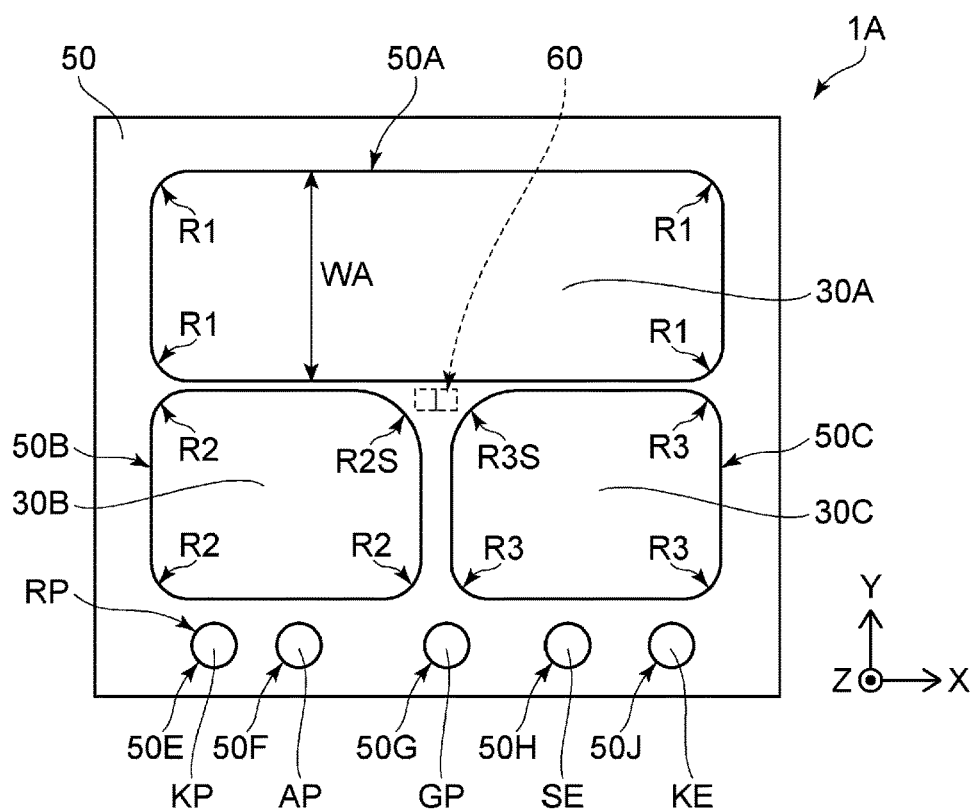
FIG. 2A and FIG. 2B are schematic diagrams showing a semiconductor device according to an embodiment.
Figure 2B:
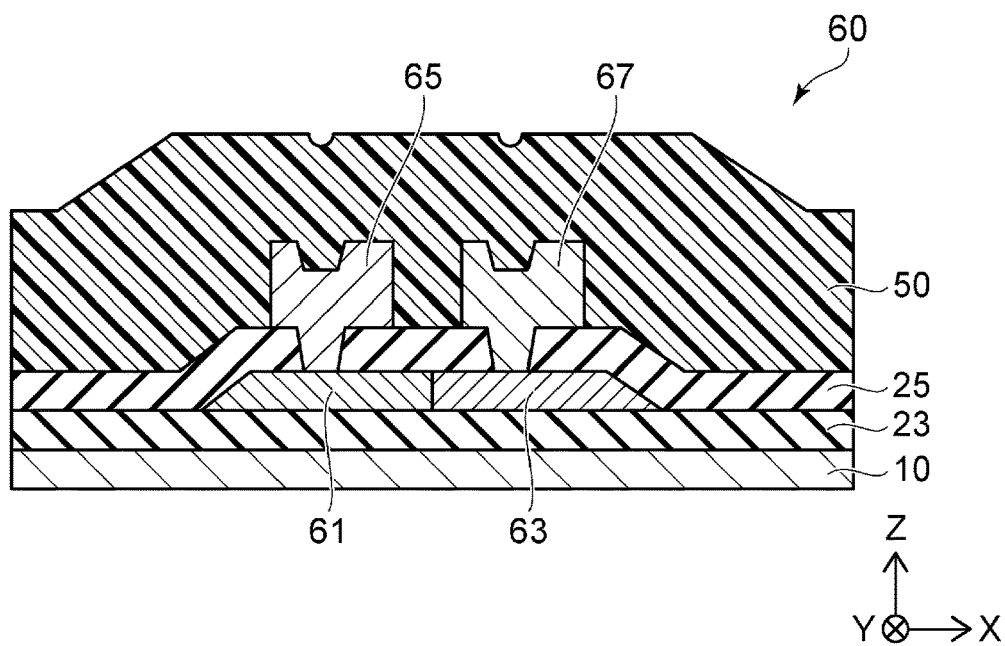

FIGS. 2A and 2B are another schematic diagrams showing the semiconductor device 1A. FIG. 2A is a plan view showing a front or upper surface of the resin layer 50. FIG. 2B is a cross-sectional view taken along a line B-B shown in FIG. 1B.

As shown in FIG. 2A, the resin layer 50 has openings 50A to 50C. A part of the second electrodes 30A to 30C is exposed through the openings 50A to 50C, respectively. The openings 50A to 50C are provided, for example, in a square shape having rounded corners.

The opening 50A has a curvature radius R1 at each corner. The curvature radius R1 at the four corners of the opening 50A may be identical or different. The same applies to curvature radii R2 and R3 of the openings 50B and 50C.

The opening 50A is formed by selectively removing a part of the resin layer 50 that covers the front surface of the semiconductor layer 10 by, for example, wet etching. A thickness of the resin layer 50 in the Z direction is, for example, 10 micrometers (hereinafter, referred to as µm) or more. Therefore, if the curvature radius R1 of the opening 50A is small, etching residue tends to remain in the opening. If an opening width WA along a short side of the opening 50A is narrow, a residue may remain inside the opening.

FIG. 15A is a schematic plan view showing the residue remaining in a corner portion of the resin opening. FIG. 15B is a schematic plan view showing a residue remaining in the center of the resin opening. FIG. 15C is a table showing a relationship between a dimension of the opening and presence or absence of the residue. The dimension shown in FIG. 15C includes a curvature radius RC of the corner portion and an opening width WL.

As shown in FIG. 15C, when the curvature radius RC of the corner portion is 20 µm or 100 µm, the residue as shown in FIG. 15A remains. On the other hand, when the curvature radius RC is 300 µm or 600 µm, the residue does not occur in the corner portion. That is, FIG. 15C shows that if the curvature radius RC is 300 µm or more, the residue does not occur in the corner portion.

As shown in FIG. 15C, when the opening width WL is 20 µm, 100 µm, or 300 µm, the residue shown in FIG. 15B occurs in the opening. On the other hand, when the opening width WL is 600 µm, the residue does not occur in the opening. That is, FIG. 15C shows that if the opening width WL is 600 µm or more, the residue does not occur in the opening.

In this way, by setting the curvature radius R1 in the opening 50A to 300 µm or more, it is possible to prevent an etching residue from being generated at the corner portion. In addition, if the opening width WA of the opening 50A is set to 600 µm or more, it is possible to prevent the etching residue from being generated. The opening 50A preferably has the opening width WA of 600 µm or more, and has the curvature radius R1 of 300 µm or more at each corner. The same also applies to other openings 50B and 50C.

FIG. 15D shows another example of a sensor arrangement. In this example, a resin layer that covers an arrangement region of the sensor is provided at corner portions of openings surrounding the sensor so as to protrude toward opening sides. Accordingly, it is possible to allocate a space for disposing the sensor among the openings. However, in a process of selectively etching the resin layer to form each opening, a tip end of the portion protruding toward the opening side may be etched into an unintended shape. Such etching abnormality of the opening is determined to be a shape defect, which causes a decrease in manufacturing yield. In the embodiment shown in the FIG. 2A, since each opening has rounded corners, such a shape defect does not occur, and the manufacturing yield can be improved.

As shown in FIG. 2A, the openings 50B and 50C are also each formed in the square shape having four rounded corners. The opening 50B is provided such that the curvature radius R2 of the three corners is, for example, 300 µm or more. In addition, the opening 50B has a curvature radius R2S at another corner. The curvature radius R2S is, for example, larger than the curvature radius R2. The opening width in the direction along the short side of the opening 50B is 600 µm or more.

The opening 50C is also provided such that a curvature radius R3 of the three corners is, for example, 300 µm or more. Further, a curvature radius R3S at another corner of the opening 50C is larger than the curvature radius R3. The opening width in the direction along the short side of the opening 50C is also 600 µm or more.

The sensor element 60 is provided between a region of the resin layer 50 surrounded by one side of the opening 50A, one corner of the opening 50B, and one corner of the opening 50C and the semiconductor layer 10. The one corner of the opening 50B has the curvature radius R2S, and the one corner of the opening 50C has the curvature radius R3S. The curvature radii R2S and R3S are preferably 1000 µm or more. The curvature radii R2S and R3S are, for example, 1028 µm. Accordingly, the region of the resin layer 50 surrounded by the one side of the opening 50A, the one corner of the opening 50B, and the one corner of the opening 50C can have a sufficient area to cover the sensor element 60.

The resin layer 50 further includes openings 50E, 50F, 50G, 50H, and 50J. The opening 50E exposes the contact pad KP, and the opening 50F exposes the contact pad AP. The opening 50G exposes the contact pad GP. Further, the opening 50H exposes the contact pad SE, and the opening 50J exposes the contact pad KE. The openings 50E, 50F, 50G, 50H, and 50J are each formed, for example, in a circular shape with a radius of 300 µm or more. Accordingly, the residue (see FIG. 15B) at the time of selectively etching the resin layer 50 can be removed.

FIG. 2B is a cross-sectional view showing a structure of the sensor element 60. The sensor element 60 includes a first conductivity type first semiconductor region 61, a second conductivity type second semiconductor region 63, a first sensor electrode 65, and a second sensor electrode 67.

The first semiconductor region 61 and the second semiconductor region 63 are provided on the semiconductor layer 10 via, for example, an insulating film 23. The first semiconductor region 61 is, for example, n-type polysilicon. The second semiconductor region 63 is, for example, p-type polysilicon. The insulating film 23 is, for example, a silicon oxide film. The first semiconductor region 61 is in contact with the second semiconductor region 63. That is, the sensor element 60 is a temperature sensor implemented by a pn-junction-type diode.

The first semiconductor region 61 and the second semiconductor region 63 on the insulating film 23 are covered with an insulating film 25. The insulating film 25 is, for example, a silicon oxide film.

The first sensor electrode 65 is electrically connected to the first semiconductor region 61 via a contact hole provided in the insulating film 25. The first sensor electrode 65 is, for example, a cathode electrode. The first sensor electrode 65 is electrically connected to the contact pad KP via the sensor wiring KI. The first sensor electrode 65 is, for example, a metal layer containing aluminum.

The second sensor electrode 67 is electrically connected to the second semiconductor region 63 via a contact hole provided in the insulating film 25. The second sensor electrode 67 is, for example, an anode electrode. The second sensor electrode 67 is electrically connected to the contact pad AP via the sensor wiring AI. The second sensor electrode 67 is, for example, a metal layer containing aluminum.

FIGS. 3A and 3B are still another schematic diagrams showing the semiconductor device 1A. FIG. 3A is a cross-sectional view taken along a line C-C shown in FIG. 1B. FIG. 3B is a cross-sectional view taken along a line D-D shown in FIG. 1B.

As shown in FIG. 3A, the sensor wirings AI and KI are provided on the semiconductor layer 10, for example, via the insulating films 43 and 45. The sensor wirings AI and KI are, for example, metal layers containing aluminum.

As shown in FIGS. 3A and 3B, the control wiring GI is provided on, for example, the insulating film 45. The control wiring GI is electrically connected to a contact layer 47 via, for example, a contact hole provided in the insulating film 45. The contact layer 47 is, for example, conductive polysilicon provided between the insulating film 43 and the insulating film 45. The contact layer 47 is connected to the control electrode 40. The control wiring GI is electrically connected to the control electrode 40 via the contact layer 47.

FIG. 4 is a schematic diagram showing a semiconductor device 1B according to an embodiment. In this example, the resin layer 50 has the openings 50A to 50C and an opening 50L. The sensor element 60 is provided between a region of the resin layer 50 surrounded by one side of the opening 50A, one corner of the opening 50B, and one corner of the opening 50C and the semiconductor layer 10 (see FIG. 2B).

The contact pads GP, AP, KP, SE, and KE are exposed inside the opening 50L. The opening 50L, for example, extends in the X direction, and has an opening width WL in the Y direction. The opening 50L is provided, for example, such that the opening width WL is 600 µm or more. Each end of the opening 50L in the X direction is formed in a convex shape. Further, the opening 50L is provided close to one side of the resin layer 50 so as to have, for example, a curvature radius RP. The curvature radius RP is, for example, 300 µm or more.

Figure 5A:
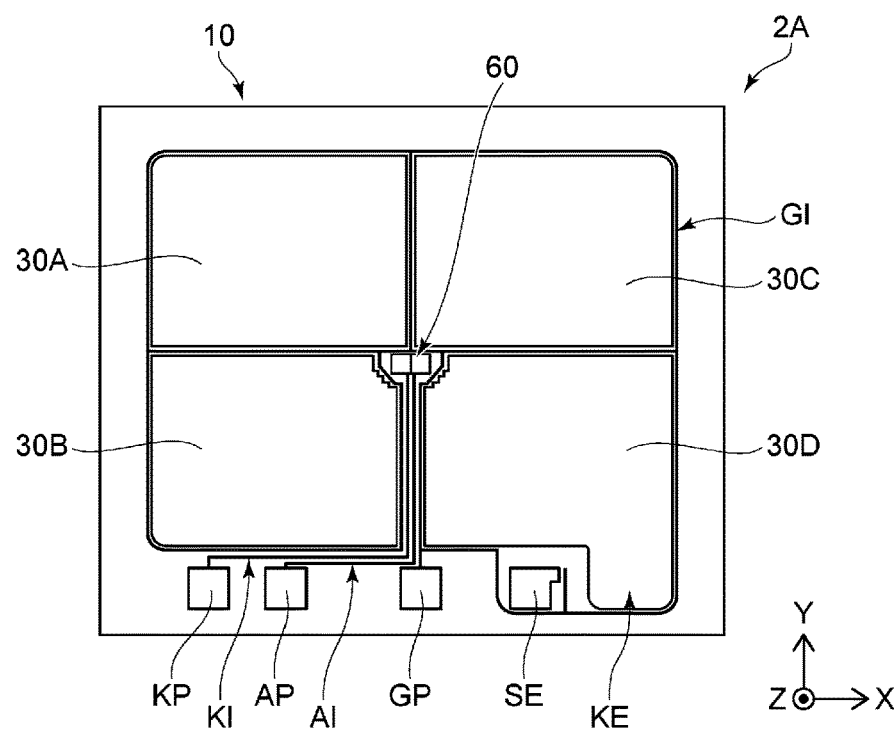
FIG. 5A and FIG. 5B are schematic diagrams showing a semiconductor device according to an embodiment.
Figure 5B:
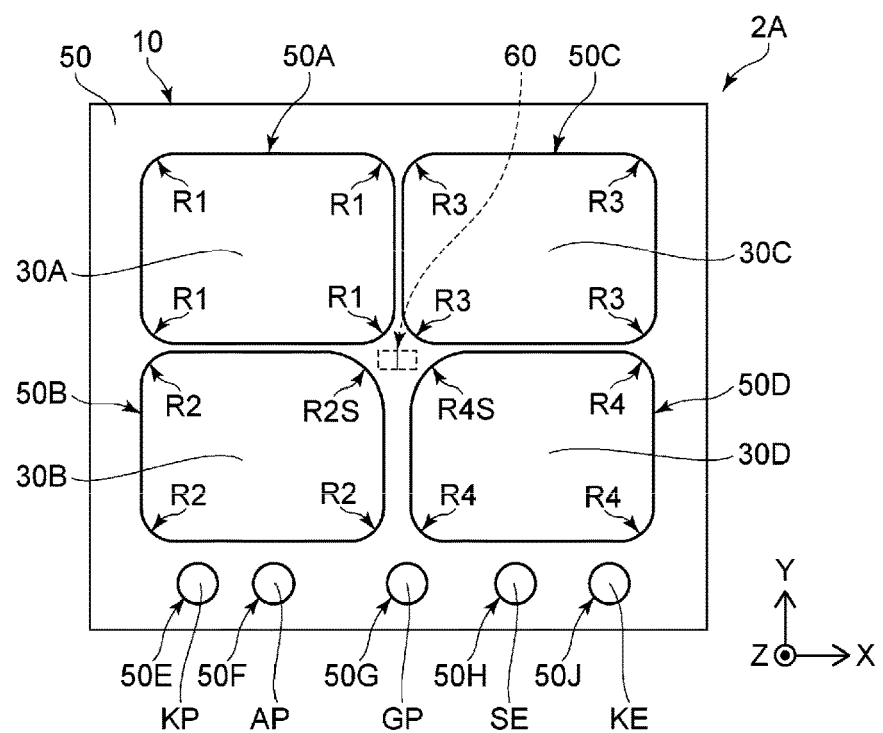

FIGS. 5A and 5B are schematic diagrams showing a semiconductor device 2A according to an embodiment. FIG. 5A is a plan view showing an upper surface of the semiconductor device 2A excluding the resin layer 50. FIG. 5B is a plan view showing a front surface of the resin layer 50.

As shown in FIG. 5A, the semiconductor device 2A includes a second electrode 30D in addition to the second electrodes 30A to 30C. The second electrodes 30A to 30D are separated from one another on the front surface of the semiconductor layer 10. The second electrodes 30A to 30D are arranged so as to surround the sensor element 60.

The contact pads GP, AP, and KP are arranged along one side of an outer edge of the semiconductor layer 10. The contact pads AP and KP are provided between the outer edge of the semiconductor layer 10 and the second electrode 30B. The contact pad GP is provided between the outer edge of the semiconductor layer 10 and the sensor element 60. The contact pad SE is provided between the outer edge of the semiconductor layer 10 and the second electrode 30D. The contact pad KE is a part of the second electrode 30D.

As shown in FIG. 5B, the resin layer 50 has an opening 50D in addition to the openings 50A to 50C. A part of the second electrodes 30A to 30D is exposed in the openings 50A to 50D, respectively. The resin layer 50 includes the openings 50E, 50F, 50G, 50H, and 50J. The contact pads KP, AP, GP, SE, and KE are exposed at the openings 50E, 50F, 50G, 50H, and 50J, respectively.

The openings 50A to 50D are each formed in a square shape having four rounded corners. The sensor element 60 is provided between a region of the resin layer 50 surrounded by one of the four corners of each of the openings 50A to 50D and the semiconductor layer 10.

The curvature radius R1 of the opening 50A is 300 µm or more. The width in the direction along the short side of the opening 50A is 600 µm or more.

The curvature radius R2S at one corner of the opening 50B is greater than the curvature radius R2 at another three corners. The curvature radius R2 is 300 µm or more. The width in the direction along the short side of the opening 50B is 600 µm or more. The curvature radius R2S is preferably 1000 µm or more. The curvature radius R2S is, for example, 1028 µm.

The curvature radius R3 of the opening 50C is 300 µm or more. The width in the direction along the short side of the opening 50C is 600 µm or more.

A curvature radius R4S at one corner of the opening 50D is greater than a curvature radius R4 at another three corners. The curvature radius R4 is 300 µm or more. The width in the direction along the short side of the opening 50D is 600 µm or more. The curvature radius R4S is preferably 1000 µm or more. The curvature radius R4S is, for example, 1028 µm.

The openings 50E, 50F, 50G, 50H, and 50J are each formed, for example, in a circular shape with a radius of 300 µm or more.

FIG. 6 is a schematic diagram showing a semiconductor device 2B according to an embodiment. FIG. 6 is a plan view showing a front or upper surface of the resin layer 50.

The semiconductor device 2B also includes the second electrodes 30A to 30D. The second electrodes 30A to 30D are arranged so as to surround the sensor element 60 (see FIG. 5A). The openings 50A to 50D shown in FIG. 6 expose a part of the second electrodes 30A to 30D respectively from the resin layer 50. The openings 50A to 50D are each formed in a square shape having four rounded corners. The sensor element 60 is provided between a region of the resin layer 50 surrounded by one of the four corners of each of the openings 50A to 50D and the semiconductor layer 10.

The resin layer 50 further includes the opening 50L. The contact pads GP, AP, KP, SE, and KE are exposed inside the opening 50L. The opening 50L, for example, extends in the X direction, and has the opening width WL in the Y direction (see FIG. 4). For example, the opening width WL is 600 µm or more. Each end of the opening 50L in the X direction is formed in a convex shape. The resin layer 50 has the curvature radius RP at the end of the opening 50L. The curvature radius RP is, for example, 300 µm or more.

Even if the opening 50L is provided, it is preferable to leave a resin that covers a part of the gate wiring GI (see FIG. 1B) located between the contact pads GP and SE and between the contact pads SE and KE.

Figure 7A:
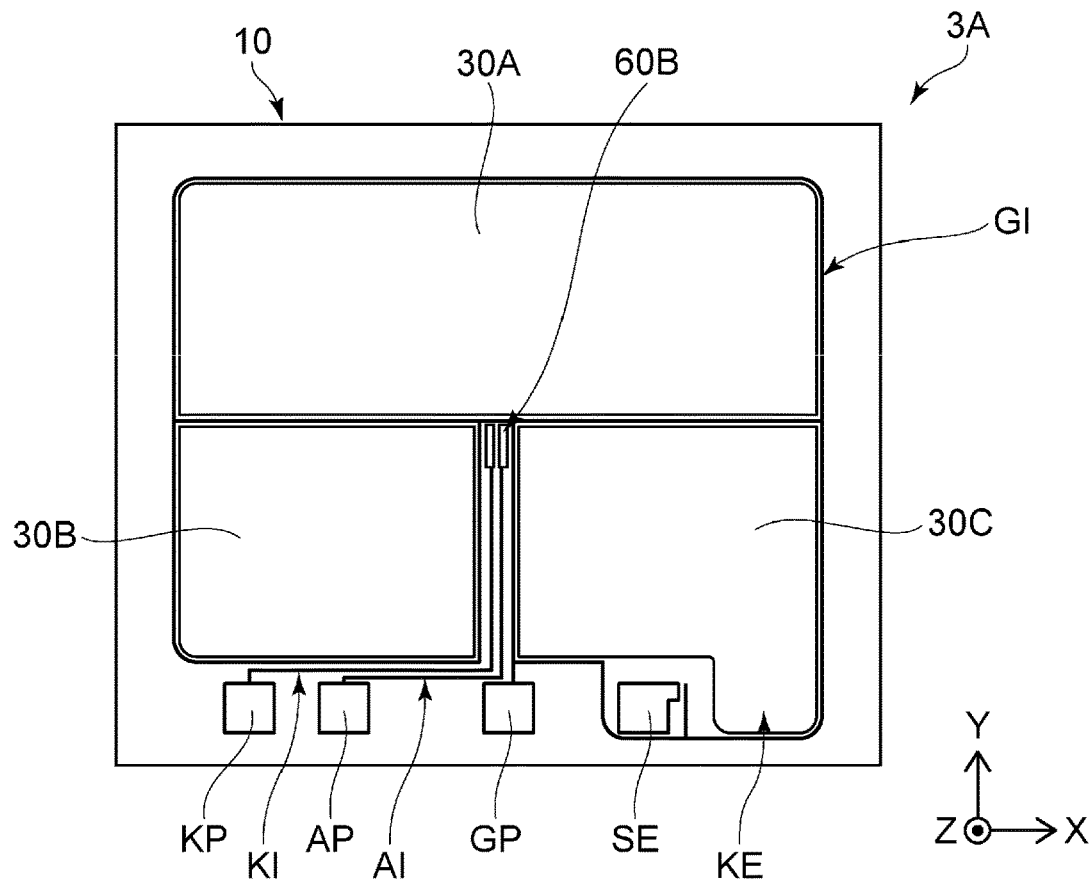
FIG. 7A and FIG. 7B are schematic diagrams showing a semiconductor device according to an embodiment.
Figure 7B:
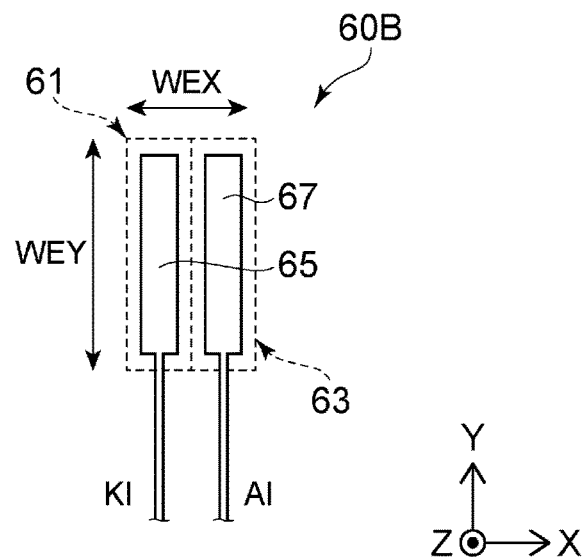

FIGS. 7A and 7B are schematic diagrams showing a semiconductor device 3A according to an embodiment. FIG. 7A is a plan view showing an upper surface of the semiconductor device 3A excluding the resin layer 50. FIG. 7B is a plan view showing a sensor element 60B.

As shown in FIG. 7A, the semiconductor device 3A includes the plurality of second electrodes 30A to 30C. The semiconductor device 3A further includes the sensor element 60B, the control wiring GI, and the sensor wirings KI and AI.

The sensor element 60B is provided between the second electrode 30B and the second electrode 30C. The sensor element 60B faces one side of the second electrode 30A. The control wiring GI is provided along outer edges of the second electrodes 30A to 30C so as to surround each of the second electrodes 30A to 30C. The sensor wirings KI and AI are provided in a space between the second electrode 30B and the second electrode 30C, and are connected to the sensor element 60B.

As shown in FIG. 7B, the sensor element 60B includes the first semiconductor region 61, the second semiconductor region 63, the first sensor electrode 65, and the second sensor electrode 67 (see FIG. 2B). The first sensor electrode 65 is provided on the first semiconductor region and electrically connected to the first semiconductor region 61. The second sensor electrode 67 is provided on the second semiconductor region 63 and electrically connected to the second semiconductor region 63. The first sensor electrode 65 is connected to the sensor wiring KI, and the second sensor electrode 67 is connected to the sensor wiring AI.

The first semiconductor region 61 and the second semiconductor region 63 each extend in a direction in which the sensor wirings KI and AI extend (for example, the Y direction). A width WEY of each of the first semiconductor region 61 and the second semiconductor region 63 in the Y direction is wider than a width WEX in the X direction in which the first semiconductor region 61 and the second semiconductor region 63 are combined. The sensor element 60B is fitted to the space between the second electrode 30B and the second electrode 30C.

Figure 8A:
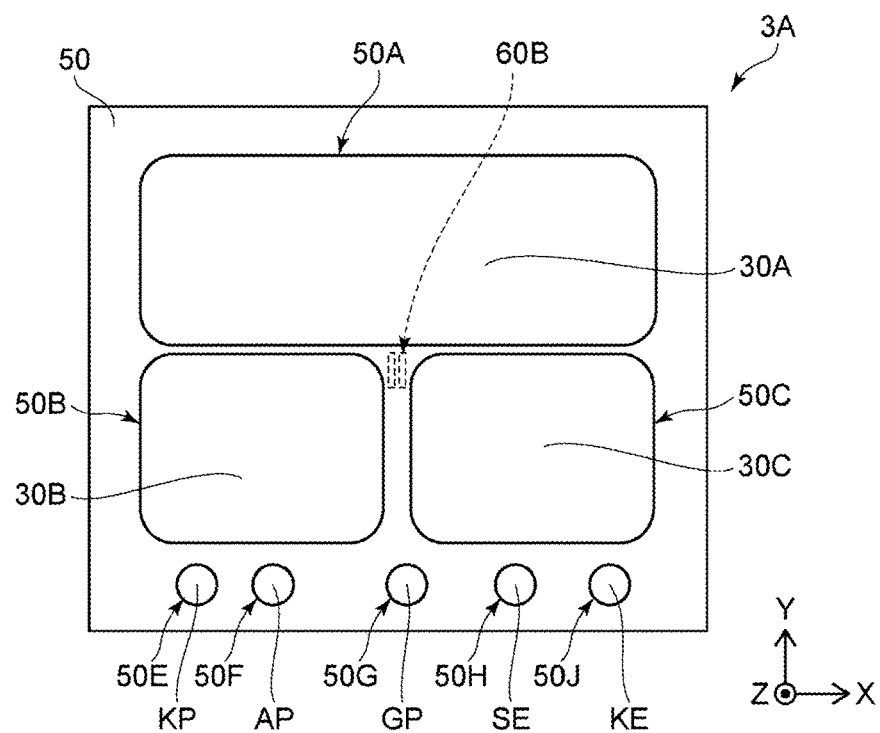
FIG. 8A and FIG. 8B are schematic diagrams showing semiconductor devices according to an embodiment.
Figure 8B:
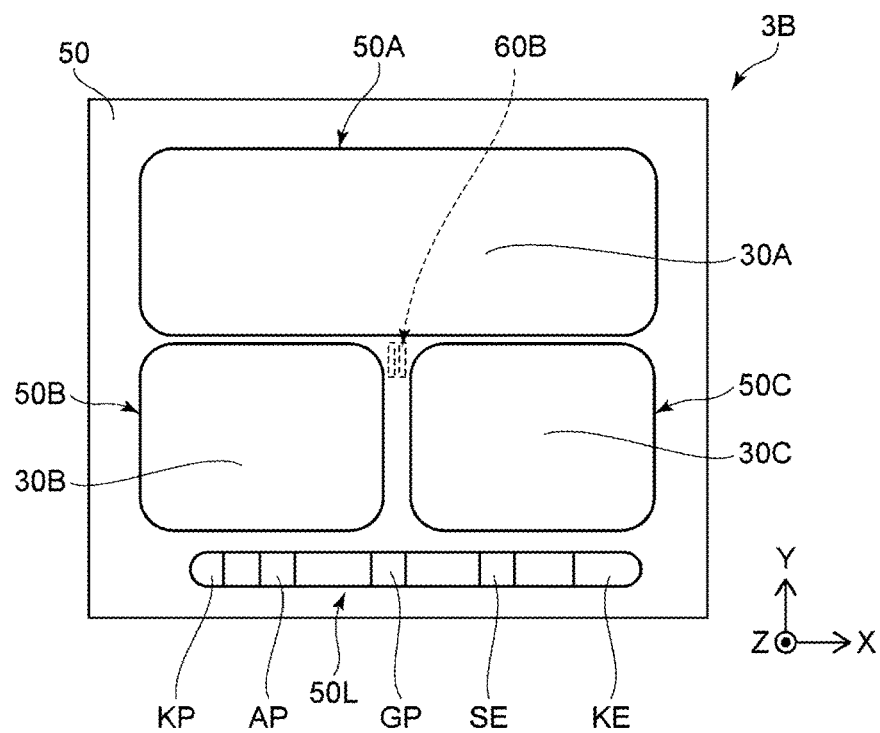

FIGS. 8A and 8B are schematic plan views showing the semiconductor device 3A and a semiconductor device 3B according to an embodiment. FIGS. 8A and 8B are plan views showing a front or upper surface of the resin layer 50.

As shown in FIG. 8A, the resin layer 50 of the semiconductor device 3A has the openings 50A to 50C. A part of the second electrodes 30A to 30C is exposed in the openings 50A to 50C, respectively. The openings 50A to 50C are provided, for example, in a square shape having rounded corners. The sensor element 60B is provided between a region of the resin layer 50 surrounded by one side of the opening 50A, one corner of the opening 50B, and one corner of the opening 50C and the semiconductor layer 10.

The curvature radius of the corners of the openings 50A to 50C is preferably 300 µm or more. All curvature radii may be the same as, for example, 600 µm, or may be different values.

The resin layer 50 further includes the openings 50E, 50F, 50G, 50H, and 50J. The opening 50E exposes the contact pad KP, and the opening 50F exposes the contact pad AP. The opening 50G exposes the contact pad GP. Further, the opening 50H exposes the contact pad SE, and the opening 50J exposes the contact pad KE. The openings 50E, 50F, 50G, 50H, and 50J are each formed, for example, in a circular shape with a radius of 300 µm or more.

As shown in FIG. 8B, the resin layer 50 of the semiconductor device 3B has the opening 50L instead of the openings 50E, 50F, 50G, 50H, and 50J. The contact pads GP, AP, KP, SE, and KE are exposed inside the opening 50L. The opening 50L, for example, extends in the X direction, and has the opening width WL in the Y direction (see FIG. 4). The opening 50L is provided, for example, such that the opening width WL is 600 µm or more. Each end of the opening 50L in the X direction is formed in a convex shape. The resin layer 50 has, for example, the curvature radius RP of 300 µm or more (see FIG. 4) at the end of the opening 50L.

Figure 9A:
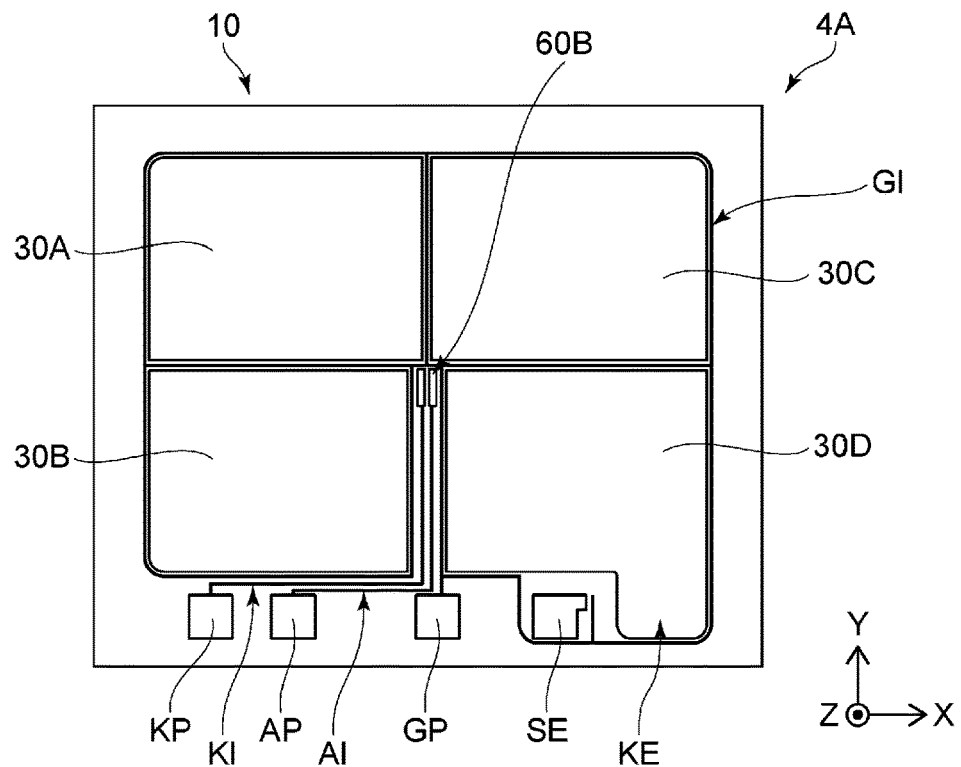
FIG. 9A and FIG. 9B are schematic diagrams showing a semiconductor device according to an embodiment.
Figure 9B:
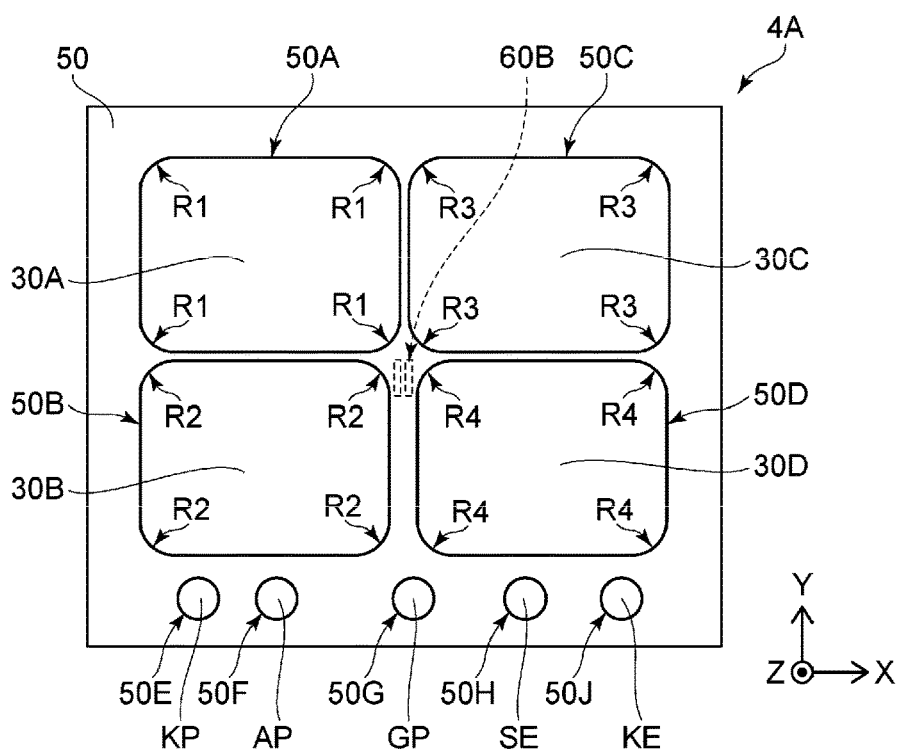

FIGS. 9A and 9B are schematic diagrams showing a semiconductor device 4A according to an embodiment. FIG. 9A is a plan view showing an upper surface of the semiconductor device 4A excluding the resin layer 50. FIG. 9B is a plan view showing a front surface of the resin layer 50.

As shown in FIG. 9A, the semiconductor device 4A includes the second electrodes 30A to 30D. The semiconductor device 4A further includes the sensor element 60B, the control wiring GI, the sensor wirings KI and AI, and the contact pads GP, AP, KP, SE, and KE.

The sensor element 60B is provided between the second electrode 30B and the second electrode 30D. The sensor element 60B faces one corner of each of the second electrodes 30A and 30C. The control wiring GI is provided along outer edges of the second electrodes 30A to 30D so as to surround each of the second electrodes 30A to 30D. The sensor wirings KI and AI extend between the second electrode 30B and the second electrode 30D and are connected to the sensor element 60B.

The contact pads GP, AP, and KP are arranged along one side of the outer edge of the semiconductor layer 10. The contact pads AP and KP are provided between the outer edge of the semiconductor layer 10 and the second electrode 30B. The contact pad GP is provided between the outer edge of the semiconductor layer 10 and the sensor element 60B. The contact pad SE is provided between the outer edge of the semiconductor layer 10 and the second electrode 30D. The contact pad KE is a part of the second electrode 30D.

As shown in FIG. 9B, the resin layer 50 has the openings 50A to 50D. A part of the second electrodes 30A to 30D is exposed in the openings 50A to 50D, respectively. The resin layer 50 includes the openings 50E, 50F, 50G, 50H, and 50J. The contact pads KP, AP, GP, SE, and KE are exposed at the openings 50E, 50F, 50G, 50H, and 50J, respectively.

The openings 50A to 50D are each formed in a square shape having four rounded corners. The curvature radius of the corners of the openings 50A to 50D is preferably 300 µm or more. All curvature radii may be, for example, 600 µm or may have different values.

The sensor element 60B is provided between a region of the resin layer 50 surrounded by one of the four corners of each of the openings 50A to 50D and the semiconductor layer 10. The openings 50E, 50F, 50G, 50H, and 50J are each formed, for example, in a circular shape with a radius of 300 µm or more.

Figure 10:
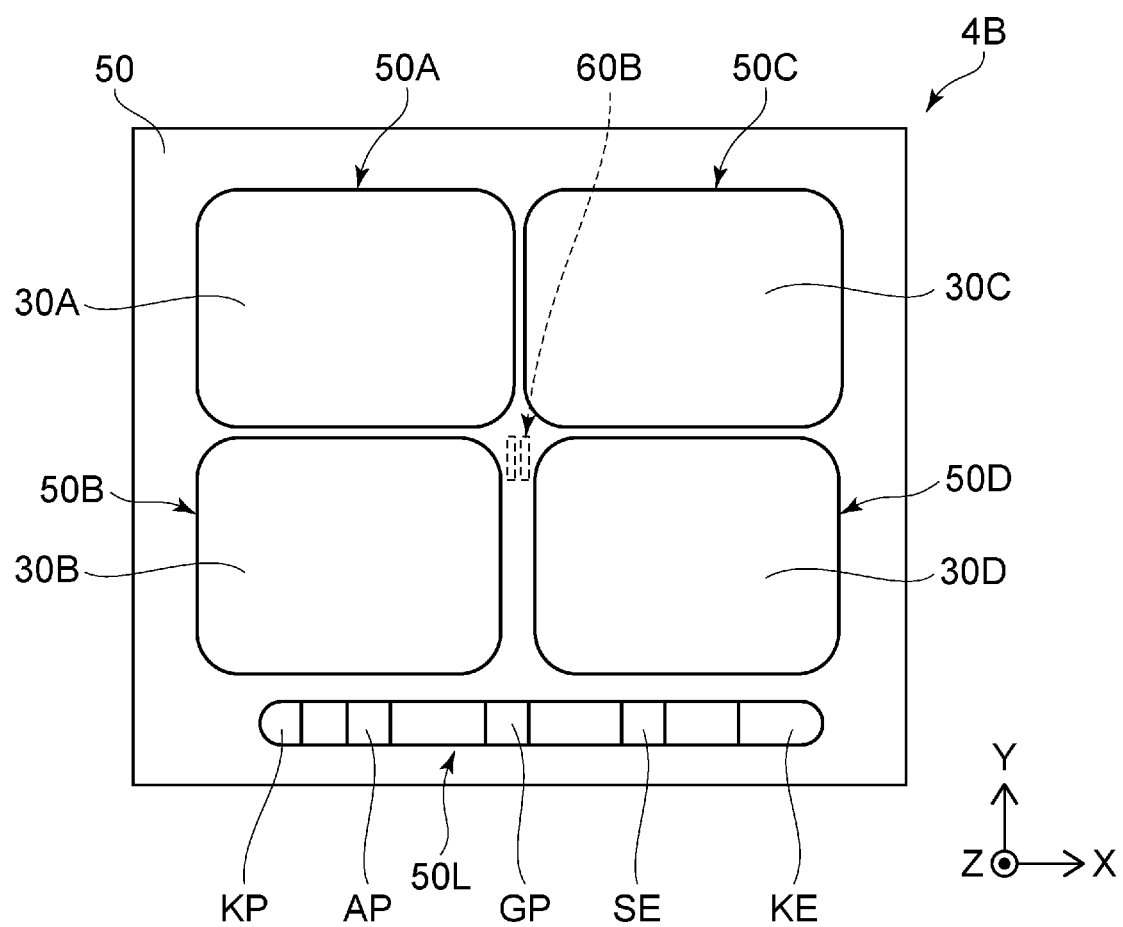
FIG. 10 is a schematic diagram showing a semiconductor device according to an embodiment.

FIG. 10 is a schematic diagram showing a semiconductor device 4B according to an embodiment. FIG. 10 is a plan view showing the front surface of the resin layer 50. The semiconductor device 4B also includes the second electrodes 30A to 30D.

The openings 50A to 50D shown in FIG. 10 expose a part of the second electrodes 30A to 30D from the resin layer 50, respectively. The openings 50A to 50D are each formed in a square shape having four rounded corners. The sensor element 60B is provided between a region of the resin layer 50 surrounded by one of the four corners of each of the openings 50A to 50D and the semiconductor layer 10.

The resin layer 50 further includes the opening 50L. The contact pads GP, AP, KP, SE, and KE are exposed inside the opening 50L. The opening 50L, for example, extends in the X direction, and has the opening width WL in the Y direction (see FIG. 4). For example, the opening width WL is 600 µm or more. Each end of the opening 50L in the X direction is formed in a convex shape. The opening 50L is provided at an end of the resin layer 50 so as to have the curvature radius RP (see FIG. 4). The curvature radius RP is, for example, 300 µm or more.

Figure 11A:
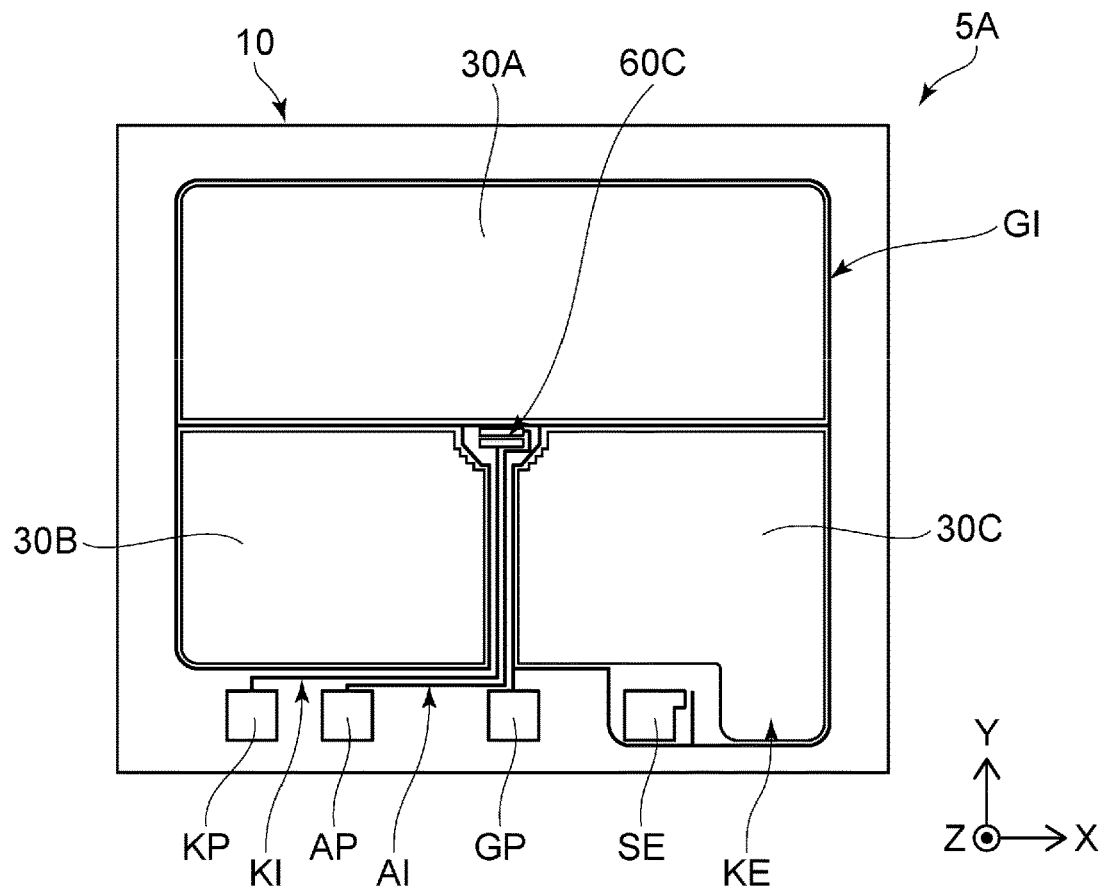
FIG. 11A and FIG. 11B are schematic diagrams showing a semiconductor device according to an embodiment.
Figure 11B:
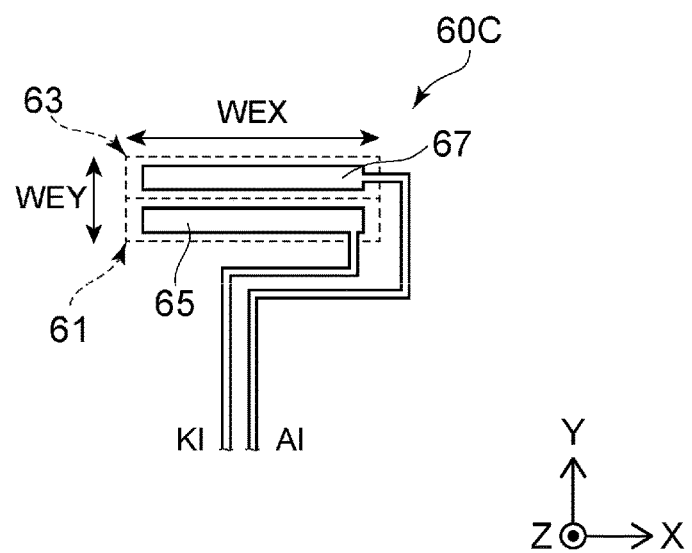

FIGS. 11A and 11B are schematic diagrams showing a semiconductor device 5A according to an embodiment. FIG. 11A is a plan view showing an upper surface of the semiconductor device 5A excluding the resin layer 50. FIG. 11B is a plan view showing a sensor element 60C.

As shown in FIG. 11A, the semiconductor device 5A includes the second electrodes 30A to 30C. The semiconductor device 5A further includes the sensor element 60C, the control wiring GI, the sensor wirings KI and AI, and the contact pads GP, AP, KP, SE, and KE.

The sensor element 60C is provided in a region surrounded by one side of the second electrode 30A, one corner of the second electrode 30B, and one corner of the second electrode 30C. The control wiring GI is provided along outer edges of the second electrodes 30A to 30C so as to surround each of the second electrodes 30A to 30C. The sensor wirings KI and AI are provided in a space between the second electrode 30B and the second electrode 30C, and are connected to the sensor element 60C.

The contact pads GP, AP, and KP are arranged along one side of the semiconductor layer 10. The contact pads AP and KP are provided between the second electrode 30B and one side of the semiconductor layer 10. The contact pad GP is provided between the sensor element 60C and one side of the semiconductor layer 10. The contact pad SE is provided between the second electrode 30C and one side of the semiconductor layer 10. The contact pad KE is a part of the second electrode 30C.

As shown in FIG. 11B, the sensor element 60C includes the first semiconductor region 61, the second semiconductor region 63, the first sensor electrode 65, and the second sensor electrode 67 (see FIG. 2B). The first sensor electrode 65 is provided on the first semiconductor region and electrically connected to the first semiconductor region 61. The second sensor electrode 67 is provided in the second semiconductor region 63 and electrically connected to the second semiconductor region 63. The first sensor electrode 65 is connected to the sensor wiring KI, and the second sensor electrode 67 is connected to the sensor wiring AI.

The first semiconductor region 61 and the second semiconductor region 63 each extend along a direction (for example, the X direction) intersecting the direction in which the sensor wirings KI and AI extend. A width WEY in the Y direction in which the first semiconductor region 61 and the second semiconductor region 63 are combined is narrower than a width WEX of each of the first semiconductor region 61 and the second semiconductor region 63 in the X direction.

Figure 12A:
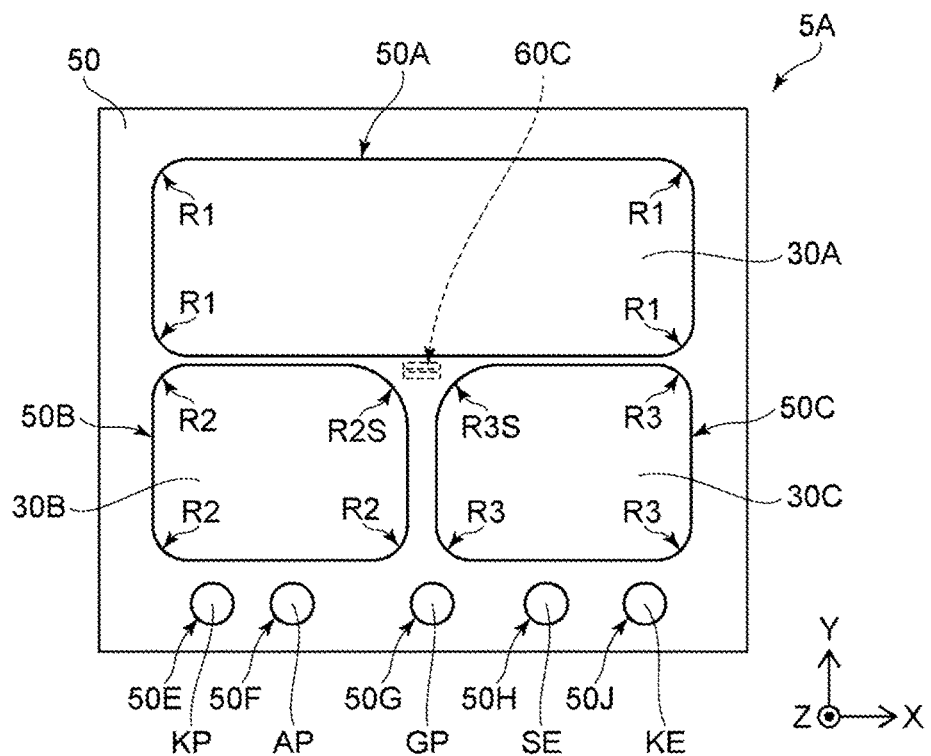
FIG. 12A and FIG. 12B are schematic diagrams showing semiconductor devices according to a modification of an embodiment.
Figure 12B:
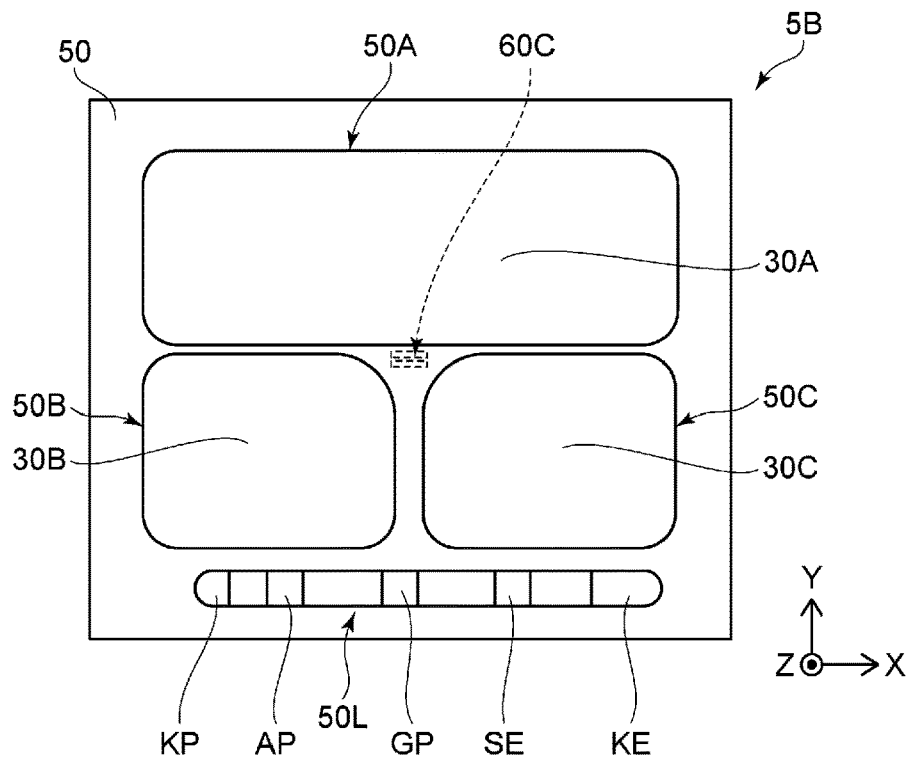

FIGS. 12A and 12B are schematic diagrams showing the semiconductor device 5A and a semiconductor device 5B according to an embodiment. FIGS. 12A and 12B are plan views showing a front surface of the resin layer 50.

As shown in FIG. 12A, the resin layer 50 of the semiconductor device 5A has the openings 50A to 50C. A part of the second electrodes 30A to 30C are exposed in the openings 50A to 50C, respectively. The openings 50A to 50C are provided, for example, in a square shape having rounded corners.

The curvature radius R1 of the four corners of the opening 50A is, for example, 300 μm or more. For example, the curvature radii R2 and R3 of the three corners of the openings 50B and 50C are 300 μm or more. Further, one corner of the opening 50B has the curvature radius R2S, and one corner of the opening 50C has the curvature radius R3S. The curvature radii R2S and R3S are preferably 1000 μm or more. The curvature radii R2S and R3S are, for example, 1028 μm. The opening width in the direction along the short side of each of the openings 50A to 50B is 600 μm or more.

The sensor element 60C is provided between a region of the resin layer 50 surrounded by one side of the opening 50A, one corner of the opening 50B that has the curvature radius R2S, and one corner of the opening 50C that has the curvature radius R3S and the semiconductor layer 10 (see FIG. 2B).

The resin layer 50 further includes the openings 50E, 50F, 50G, 50H, and 50J. The opening 50E exposes the contact pad KP, and the opening 50F exposes the contact pad AP. The opening 50G exposes the contact pad GP. Further, the opening 50H exposes the contact pad SE, and the opening 50J exposes the contact pad KE. The openings 50E, 50F, 50G, 50H, and 50J are each formed, for example, in a circular shape with a radius of 300 μm or more.

As shown in FIG. 12B, the resin layer 50 of the semiconductor device 5B has the opening 50L instead of the openings 50E, 50F, 50G, 50H, and 50J. The contact pads GP, AP, KP, SE, and KE are exposed inside the opening 50L. The opening 50L, for example, extends in the X direction, and has the opening width WL in the Y direction (see FIG. 4). For example, the opening width WL is 600 μm or more. Each end of the opening 50L in the X direction is formed in a convex shape. The opening 50L is provided at an end of the resin layer 50 so as to have the curvature radius RP of, for example, 300 μm or more (see FIG. 4).

Figure 13A:
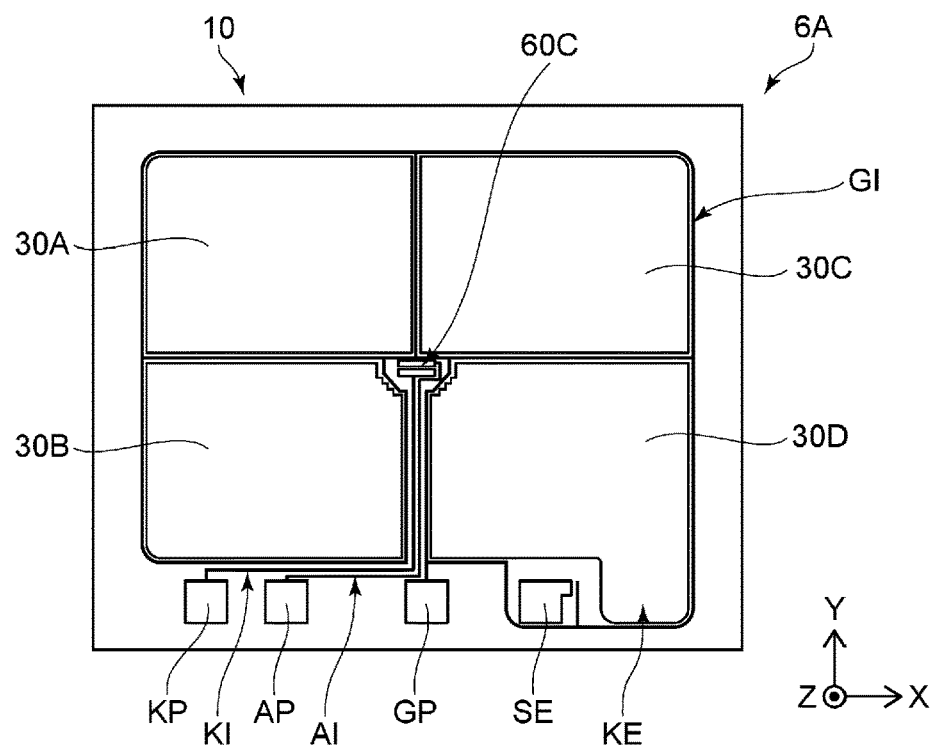
FIG. 13A and FIG. 13B are schematic diagrams showing a semiconductor device according to another modification of an embodiment.
Figure 13B:
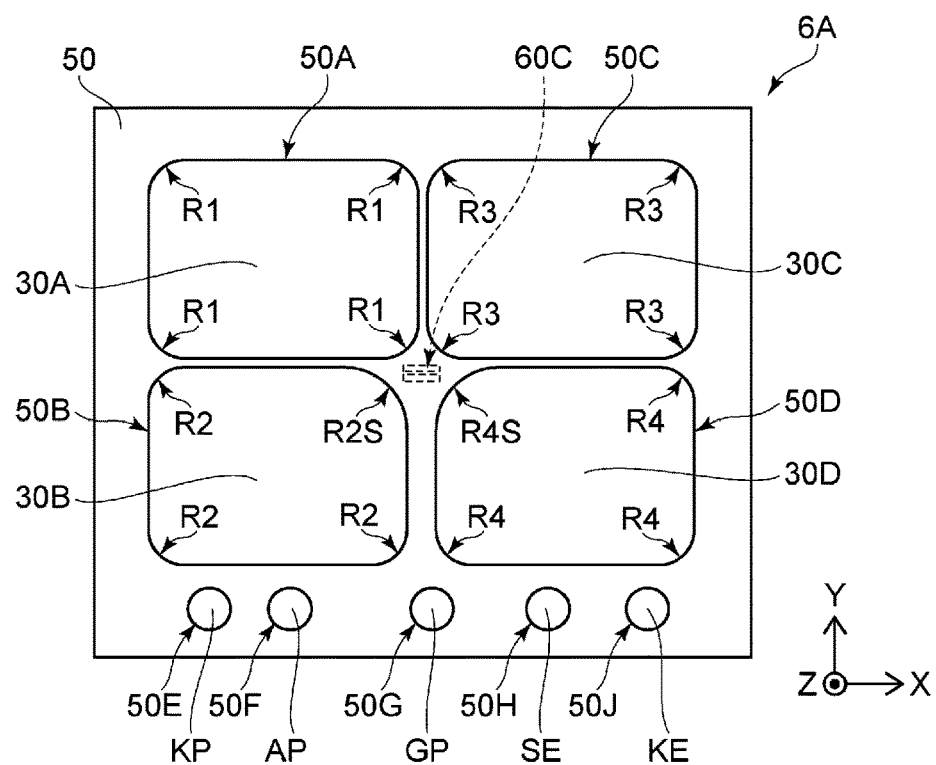

FIGS. 13A and 13B are schematic diagrams showing a semiconductor device 6A according to an embodiment. FIG. 13A is a plan view showing an upper surface of the semiconductor device 6A excluding the resin layer 50. FIG. 13B is a plan view showing a front surface of the resin layer 50.

As shown in FIG. 13A, the semiconductor device 6A includes the second electrodes 30A to 30D. The semiconductor device 5A further includes the sensor element 60C, the control wiring GI, the sensor wirings KI and AI, and the contact pads GP, AP, KP, SE, and KE.

The sensor element 60C is provided in a region surrounded by the corners of each of the second electrodes 30A to 30D. The control wiring GI is provided along outer edges of the second electrodes 30A to 30D so as to surround each of the second electrodes 30A to 30D. The sensor wirings KI and AI are provided in a space between the second electrode 30B and the second electrode 30D, and are connected to the sensor element 60C.

The contact pads GP, AP, and KP are arranged along one side of the outer edge of the semiconductor layer 10. The contact pads AP and KP are provided between the outer edge of the semiconductor layer 10 and the second electrode 30B. The contact pad GP is provided between the outer edge of the semiconductor layer 10 and the sensor element 60C. The contact pad SE is provided between the outer edge of the semiconductor layer 10 and the second electrode 30D. The contact pad KE is a part of the second electrode 30D.

As shown in FIG. 13B, the resin layer 50 has the openings 50A to 50D. A part of the second electrodes 30A to 30D is exposed in the openings 50A to 50D, respectively. The resin layer 50 includes the openings 50E, 50F, 50G, 50H, and 50J. The contact pads KP, AP, GP, SE, and KE are exposed at the openings 50E, 50F, 50G, 50H, and 50J, respectively.

The openings 50A to 50D are each formed in a square shape having four rounded corners. The curvature radii R1 and R3 of the corners of the openings 50A and 50C are 300 μm or more. The width in the direction along the short side of the opening 50A is 600 μm or more. The one corner of the opening 50B has the curvature radius R2S, and the one corner of the opening 50D has the curvature radius R4S. The curvature radii R2S and R4S are preferably 1000 μm or more. The curvature radii R2S and R4S are, for example, 1028 μm.

The sensor element 60C is provided between a region of the resin layer 50 surrounded by one of the four corners of each of the opening 50A and the opening 50C, the corner of the opening 50B that has curvature radius R2S, and the corner of the opening 50D that has the curvature radius R4S and the semiconductor layer 10 (see FIG. 2B). The openings 50E, 50F, 50G, 50H, and 50J are each formed, for example, in a circular shape with a radius of 300 μm or more.

Figure 14:
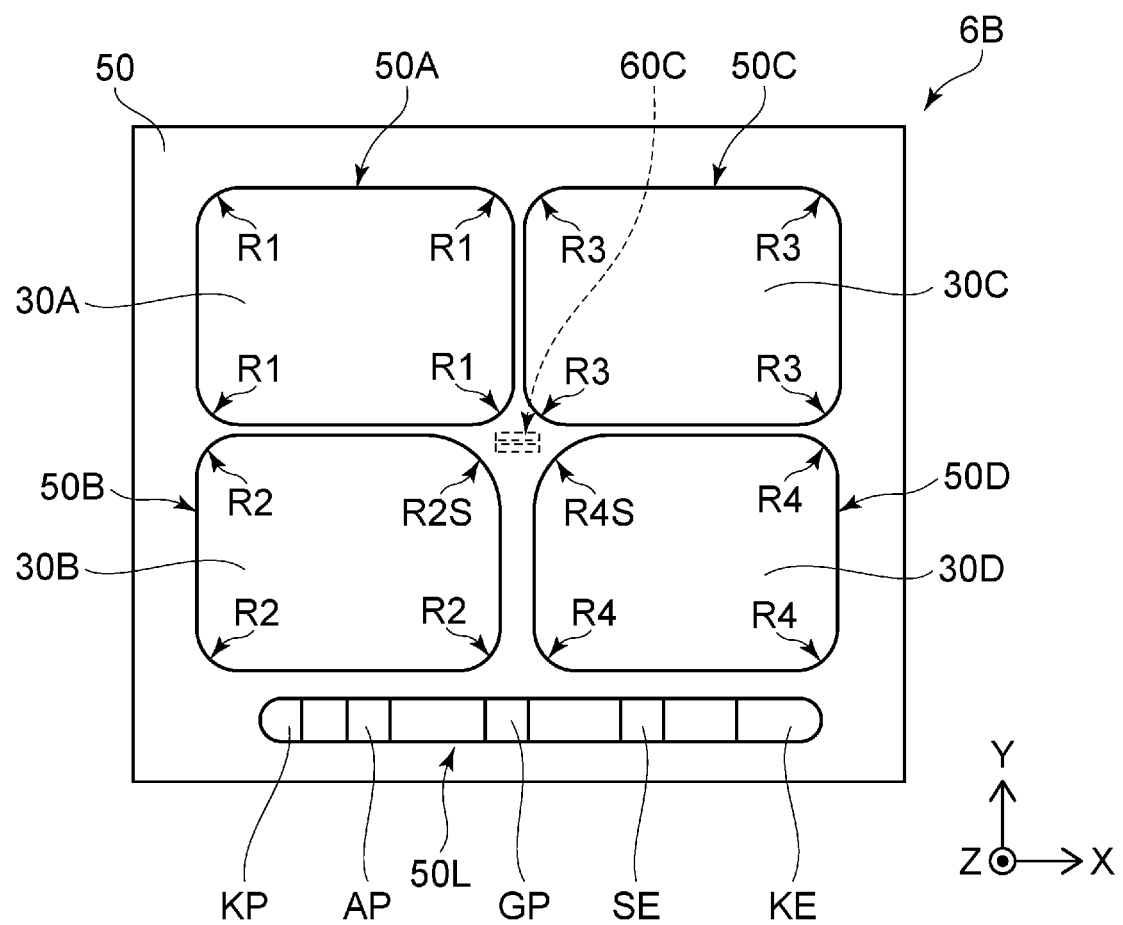
FIG. 14 is a schematic diagram showing a semiconductor device according to still another modification of an embodiment.

FIG. 14 is a schematic diagram showing a semiconductor device 6B according to an embodiment. FIG. 14 is a plan view showing a front surface of the resin layer 50. The semiconductor device 6B also includes the second electrodes 30A to 30D.

The openings 50A to 50D shown in FIG. 14 expose a part of the second electrodes 30A to 30D from the resin layer 50, respectively. The openings 50A to 50D are each formed in a square shape having four rounded corners.

The opening 50A includes four corners having the curvature radius R1. The opening 50C includes four corners having the curvature radius R3. The opening 50B includes three corners having the curvature radius R2 and one corner having the curvature radius R2S. The opening 50D includes three corners having the curvature radius R4 and one corner having the curvature radius R4S. The sensor element 60C is provided between a region of the resin layer 50 surrounded by one of the four corners of each of the opening 50A and the opening 50C, the corner of the opening 50B that has the curvature radius R2S, and the corner of the opening 50D that has the curvature radius R4S, and the semiconductor layer 10 (see FIG. 2B).

The resin layer 50 further includes the opening 50L. The contact pads GP, AP, KP, SE, and KE are exposed inside the opening 50L. The opening 50L, for example, extends in the X direction, and has the opening width WL in the Y direction (see FIG. 4). For example, the opening width WL is 600 µm or more. Each end of the opening 50L in the X direction is formed in a convex shape. The resin layer 50 has the curvature radius RP (see FIG. 4) at the end of the opening 50L. The curvature radius RP is, for example, 300 µm or more.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
   a semiconductor layer;
   a collector electrode on a first surface of the semiconductor layer;
   a plurality of emitter electrodes on a second surface of the semiconductor layer;
   a control electrode between the collector electrode and each of the plurality of emitter electrodes and electrically insulated from the semiconductor layer and each of the plurality of emitter electrodes;
   a resin layer partially covering the second surface of the semiconductor layer and having a plurality of openings through which the plurality of emitter electrodes are at least partially exposed, each of the plurality of openings having a rectangular shape with four sides and four rounded corners; and
   a sensor element above the second surface of the semiconductor layer and covered by a first part of the resin layer surrounded by the plurality of openings, wherein
   the plurality of emitter electrodes include first, second, and third emitter electrodes,
   the plurality of openings of the resin layer include first, second, and third openings through which the first, second, and third emitter electrodes, respectively, are at least partially exposed,
   portions of the first, second, and third openings that are closest to the sensor element are respectively located on one of the four sides of the first opening, one of the four rounded corners of the second opening, and one of the four rounded corners of the third opening,
   a first curvature radius of said one of the four rounded corners of the second opening that is closest to the sensor element is greater than a second curvature radius of the other three rounded corners of the second opening, and
   a third curvature radius of said one of the four rounded corners of the third opening that is closest to the sensor element is greater than a fourth curvature radius of the other three rounded corners of the third opening.

2. The semiconductor device according to claim 1, wherein the sensor element is located above a center of the second surface of the semiconductor layer.

3. The semiconductor device according to claim 1, wherein the semiconductor layer includes:
   a first conductivity type first semiconductor layer extending between the collector electrode and the plurality of emitter electrodes,
   a second conductivity type second semiconductor layer between the first semiconductor layer and each of the plurality of emitter electrodes, and
   a first conductivity type third semiconductor layer provided between the second semiconductor layer and each of the plurality of emitter electrodes, and
   each of the emitter electrodes is electrically connected to the second semiconductor layer and the third semiconductor layers.

4. The semiconductor device according to claim 3, wherein
   the first conductivity type is n-type, and
   the second conductivity type is p-type.

5. The semiconductor device according to claim 3, wherein the sensor element includes a first conductivity type semiconductor layer and a second conductivity type semiconductor layer.

6. The semiconductor device according to claim 5, wherein the sensor element is a pn-junction-type diode temperature sensor.

7. The semiconductor device according to claim 1, wherein the first opening has a greater area than the second and third openings.

8. The semiconductor device according to claim 1, wherein a curvature radius of each of the rounded corners of the plurality of openings is 300 micrometers or more.

9. The semiconductor device according to claim 1, wherein a length of a shorter side of each of the plurality of openings is 600 micrometers or more.

10. The semiconductor device according to claim 1, further comprising:
    a plurality of contact pads each electrically connected to the sensor element, wherein
    the resin layer has additional openings through which the plurality of contact pads are at least partially exposed.

11. The semiconductor device according to claim 1, further comprising:
    a plurality of contact pads each electrically connected to the sensor element, wherein
    the resin layer has an additional opening through which each of the plurality of contact pads is at least partially exposed.

12. A semiconductor device, comprising:
    a semiconductor layer;
    a collector electrode on a first surface of the semiconductor layer;
    a plurality of emitter electrodes on a second surface of the semiconductor layer;
    a control electrode between the collector electrode and each of the plurality of emitter electrodes and electrically insulated from the semiconductor layer and each of the plurality of emitter electrodes;
    a resin layer partially covering the second surface of the semiconductor layer and having a plurality of openings through which the plurality of emitter electrodes are at least partially exposed, each of the plurality of openings having a rectangular shape with four sides and four rounded corners; and a sensor element above the second surface of the semiconductor layer and covered by a first part of the resin layer surrounded by the plurality of openings, wherein the plurality of emitter electrodes include first, second, third, and fourth emitter electrodes, the plurality of openings of the resin layer include four openings including first, second, third, and fourth openings through which the first, second, third, and fourth emitter electrodes, respectively, are at least partially exposed, and the first and second openings have a greater area than the third and fourth openings, portions of the first, second, third, and fourth openings that are closest to the sensor element are respectively located on one of the four rounded corners of the first opening, one of the four rounded corners of the second opening, one of the four rounded corners of the third opening, and one of the four rounded corners of the fourth opening,.

a first curvature radius of said one of the four rounded corners of the third opening that is closest to the sensor element is greater than a second curvature radius of the other three rounded corners of the third opening, and a third curvature radius of said one of the four rounded corners of the fourth opening that is closest to the sensor element is greater than a fourth curvature radius of the other three rounded corners of the fourth opening.

13. The semiconductor device according to claim 1, wherein the second and third openings are adjacent to one another in a first direction parallel to the first and second surfaces, and the sensor element is located between the second and third openings.

14. The semiconductor device according to claim 13, wherein an electrode of the sensor element extends along a second direction crossing the first direction above the second surface of the semiconductor layer.

15. The semiconductor device according to claim 13, wherein an electrode of the sensor element extends along the first direction above the second surface of the semiconductor layer.

16. The semiconductor device according to claim 1, wherein each of the first, second, and third openings has a side directly facing a side of another one of the other openings.

17. A semiconductor device, comprising:

a semiconductor layer;

a first electrode on a first surface of the semiconductor layer;

a plurality of second electrodes on a second surface of the semiconductor layer;

a control electrode between the first electrode and each of the plurality of second electrodes and electrically insulated from the semiconductor layer and each of the plurality of second electrodes;

a resin layer partially covering the second surface of the semiconductor layer and having a plurality of openings through which the plurality of second electrodes are at least partially exposed, each of the plurality of openings having a rectangular shape with four sides and four rounded corners; and a sensor element above the second surface of the semiconductor layer and covered by a first part of the resin layer surrounded by the plurality of openings, wherein the plurality of openings of the resin layer include first, second, and third openings, and portions of the first, second, and third openings that are closest to the sensor element are respectively located on one of the four sides of the first opening, one of the four rounded corners of the second opening, and one of the four rounded corners of the third opening, a first curvature radius of said one of the four rounded corners of the second opening that is closest to the sensor element is greater than a second curvature radius of the other three rounded corners of the second opening, and a third curvature radius of said one of the four rounded corners of the third opening that is closest to the sensor element is greater than a fourth curvature radius of the other three rounded corners of the third opening.

18. The semiconductor device according to claim 17, wherein said one of the four sides of the first opening directly faces the sensor element.

19. The semiconductor device according to claim 17, wherein the sensor element is located above a center of the second surface of the semiconductor layer.

20. The semiconductor device according to claim 17, wherein the semiconductor layer includes:

a first conductivity type first semiconductor layer extending between the first electrode and the plurality of second electrodes, a second conductivity type second semiconductor layer between the first semiconductor layer and each of the plurality of second electrodes, and a first conductivity type third semiconductor layer provided between the second semiconductor layer and each of the plurality of second electrodes, and wherein each of the second electrodes is electrically connected to the second semiconductor layer and the third semiconductor layers.

21. The semiconductor device according to claim 20, wherein the first conductivity type is n-type, and the second conductivity type is p-type.

22. The semiconductor device according to claim 20, wherein the sensor element includes a first conductivity type semiconductor layer and a second conductivity type semiconductor layer.

23. The semiconductor device according to claim 22, wherein the sensor element is a pn-junction-type diode temperature sensor.

24. The semiconductor device according to claim 17, wherein the first opening has a greater area than the second and third openings.

25. The semiconductor device according to claim 17, wherein each of the first, second, and third openings has a side directly facing a side of another one of the other openings.

* * * * *